(12) United States Patent
Lin

(10) Patent No.: US 8,318,520 B2
(45) Date of Patent: *Nov. 27, 2012

(54) METHOD OF MICROMINIATURIZING A NANO-STRUCTURE

(76) Inventor: Ming-Nung Lin, Pingtung (TW)

( * ) Notice: Subject to any disclaimer, the term of this patent is extended or adjusted under 35 U.S.C. 154(b) by 1386 days.

This patent is subject to a terminal disclaimer.

(21) Appl. No.: 11/645,526

(22) Filed: Dec. 27, 2006

(65) Prior Publication Data

US 2007/0161238 A1 Jul. 12, 2007

Related U.S. Application Data

(60) Provisional application No. 60/754,614, filed on Dec. 30, 2005.

(51) Int. Cl.
*H01L 21/00* (2006.01)

(52) U.S. Cl. .......... 438/34; 438/197; 438/597; 438/671; 438/674; 438/762; 438/962; 977/762; 977/766; 977/771; 977/774; 977/938; 216/83

(58) Field of Classification Search .................... 216/83; 438/674, 762, 771, 962, 34, 197, 597; 427/72; 977/762, 766, 771, 773, 774, 938

See application file for complete search history.

(56) References Cited

U.S. PATENT DOCUMENTS

| | | | | |
|---|---|---|---|---|
| 3,755,704 A * | 8/1973 | Spindt et al. | | 313/309 |
| 5,225,131 A * | 7/1993 | Tamaru et al. | | 264/113 |
| 5,480,843 A * | 1/1996 | Park et al. | | 216/11 |
| 5,902,165 A * | 5/1999 | Levine et al. | | 445/24 |
| 6,313,905 B1 * | 11/2001 | Brugger et al. | | 355/55 |
| 6,656,568 B1 * | 12/2003 | Winningham et al. | | 428/145 |
| 6,770,353 B1 * | 8/2004 | Mardilovich et al. | | 428/209 |
| 6,962,823 B2 * | 11/2005 | Empedocles et al. | | 438/3 |
| 7,190,049 B2 * | 3/2007 | Tuominen et al. | | 257/618 |
| 7,351,607 B2 * | 4/2008 | Wang et al. | | 438/99 |
| 7,659,129 B2 * | 2/2010 | Lin | | 438/34 |
| 7,749,784 B2 * | 7/2010 | Lin | | 438/34 |
| 2002/0068369 A1 * | 6/2002 | Scherer et al. | | 438/3 |
| 2004/0127012 A1 * | 7/2004 | Jin | | 438/618 |
| 2004/0150311 A1 * | 8/2004 | Jin | | 313/309 |
| 2005/0066897 A1 * | 3/2005 | Pelhos et al. | | 118/721 |
| 2005/0181132 A1 * | 8/2005 | Mirkin et al. | | 427/256 |
| 2005/0241933 A1 * | 11/2005 | Branton et al. | | 204/192.34 |
| 2008/0247226 A1 * | 10/2008 | Liu et al. | | 365/163 |

OTHER PUBLICATIONS

Kim, Gyuman et al., "Photoplastic shadow-masks for rapid resistless multi-layer micropatterning", Jun. 10, 2001, The 11th International Conference on Solid-State Seneors and Acutators, Transducers '01, Eurosensors xV.*

* cited by examiner

*Primary Examiner* — Nadine Norton
*Assistant Examiner* — Christopher Remavege
(74) *Attorney, Agent, or Firm* — Bacon & Thomas, PLLC

(57) ABSTRACT

The present invention provides a "microminiaturizing method of nano-structure" with fabricating process steps as follows:

First deposit the material of molecule or atom state on the top-opening of the nano cylindrical pore, which having formed on the substrate, so that the diameter of said top-opening gradually reduce to become a reduced nano-aperture, whose opening diameter is smaller than that of said top-opening;

Then, directly pass the deposit material of gas molecule or atom state through said reduced nano-aperture; thereby a nano-structure of nano quantum dot, nano rod or nano ring with smaller nano scale is directly formed on the surface of said substrate, which being laid beneath the bottom of said nano cylindrical pore.

30 Claims, 29 Drawing Sheets

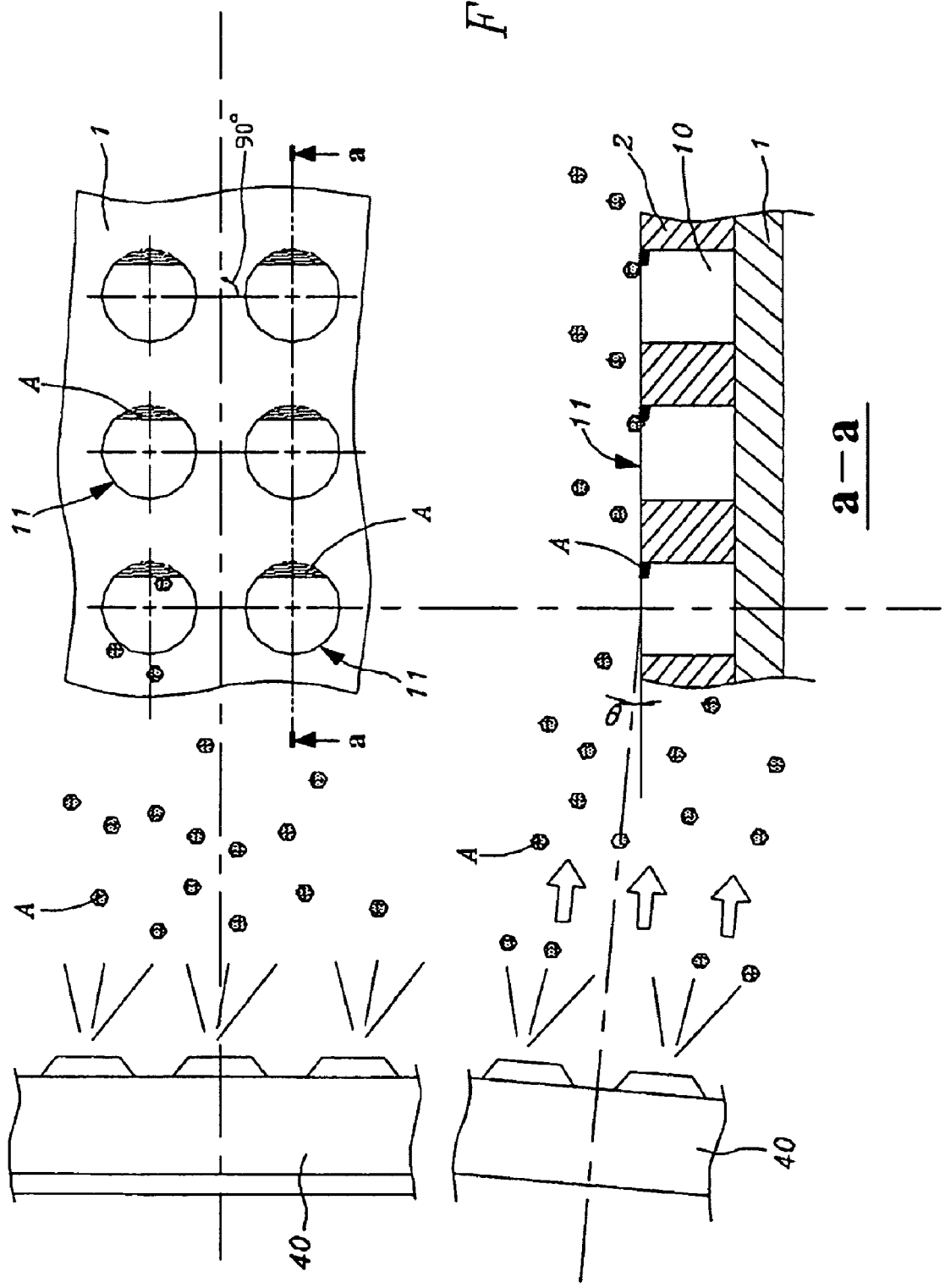

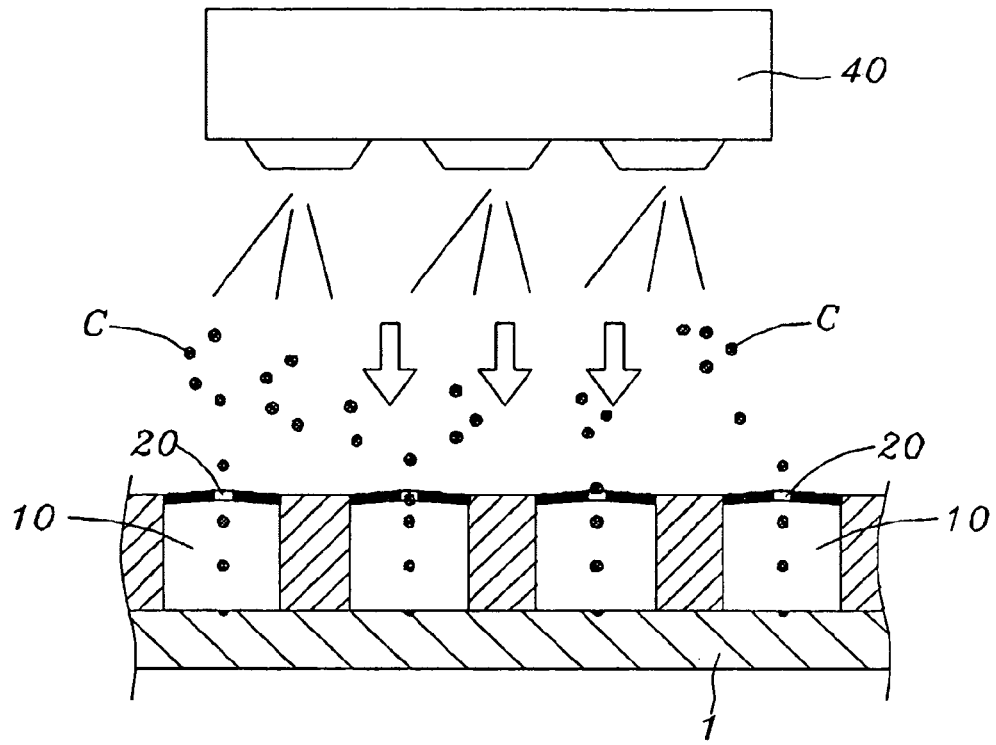
Fig. 30
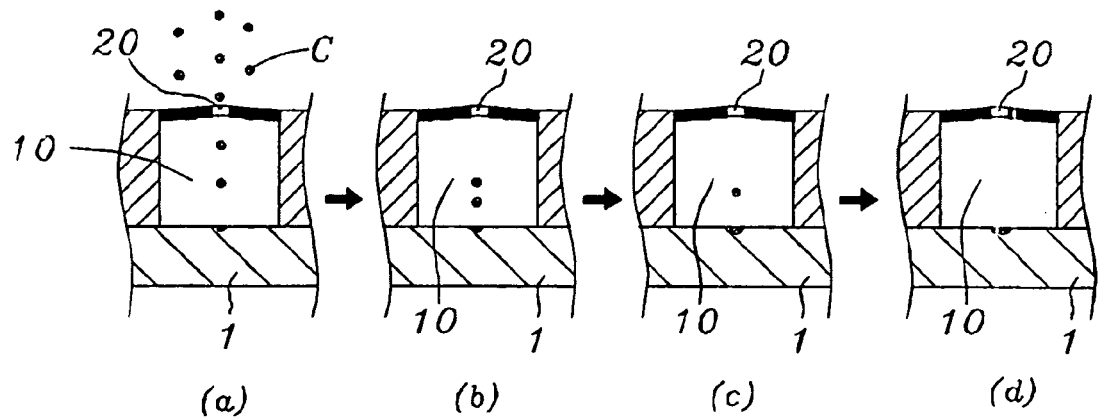
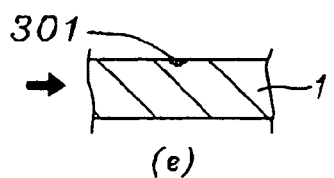
Fig. 31

METHOD OF MICROMINIATURIZING A NANO-STRUCTURE

This application claims the benefit of provisional U.S. Patent Application Ser. No. 60/754,614, filed Dec. 30, 2005.

FIELD OF THE PRESENT INVENTION

The present invention relates to the fabrication of nano-structure in more microminiaturizing manner, particularly provides an advanced microminiaturizing method in connection with the nano scale in existing variety of nano-structure and nano-device;

Especially, by directly using the current fabricating facilities, it fabricates out nano-structure of nano-quantum-dot in smaller manner, nano-rod in thinner manner and nano-ring in narrower manner than the minimum nano scale limit of the current fabricating facilities.

BACKGROUND OF THE PRESENT INVENTION

The development of the nano-science nowadays has been extensively applied in a variety of fields, especially in the semiconductor industry, which constantly produces many nano-devices and nano-components, such as:

In electronics, only few electrons instead of thousands of electrons can operate the SET (Single Electron Transistor) and spin-valve through nano-structure; thus, it not only decreases the energy and power consumption but also increases the switching speed.

In optoelectronics, the Silicon-Laser possesses the effect in regulating the characteristics of the quantum dot by means of the miniature effect of nano-structure;

In application of the transducer, the nano-sensor and nano-detector can measure and detect chemical and biological molecule in extreme trace quantity as well as intracellular function, so that the development in the miniature invasive diagnosis of biomedicine is promoted.

In other application of nano scale device such as MRAM (Magnetic Random Access Memory), spin screen/filter program and Quantum-dot Spin Memory are all in vigorous prosperity.

However, the size of all the nano-devices and nano-components reduces to some degree, the fundamental physical limit will restrict the fabricating capability in smaller nano-structure, so that it can not breakthrough towards more miniaturizing.

As shown in FIG. 1 through FIG. 3, the nano-structure is produced from conventional nano-lithography. The fabricating steps are as below:

(A): First layout the expected nano pattern Q on the photomask M, then put said photomask M on the top surface of the substrate 1, which being spread with photo-resist 2 (as shown in the FIG. 1);

(B): Pass light beam e through said nano pattern Q on said photomask M so as to have same pattern as said nano pattern Q on said photo-resist 2, which spreads on said substrate 1, by exposure and development to define the nano-aperture 3 structure (as shown in the FIG. 2);

(C): By means of deposit source device 40, directly deposit material B of gas molecule or atom state on the surroundings and bottom of said nano-aperture 3 (as shown in X view and Y view of the FIG. 3);

(D): Finally, selectively remove said photo-resist 2 by solution, thereby forming a nano quantum dot 4 structure on the surface of said substrate 1 (as shown in Z view of the FIG. 3).

The conventional process aforesaid being confined to the precision limit of the existing photolithography such that the current best precise nano-scale can only reach 60~65 nm;

Hence, the nano-scale of said nano-aperture 3 from photomask M of pattern transferring photolithography is over 60 nm; Thereby, the nano-scale of said nano quantum dot 4 fabricated from these equipment is also over 60 nm relatively; Thus, the physical size limit of said conventional nano-devices of nano-structure are still in the range of over 60 nm;

Therefore, how to breakthrough this bottleneck such that making the nano-scale of nano-aperture 3 be smaller becomes the impending crucial technical tough question of all experts in various fields; The solution being subject to the industrial practical feasibility in mass production and cost-effective economical principle so that the choice of means in technical breakthrough becomes more difficult;

The scientists who understand the nano-science and the experts who familiarize with nano-technology are all aware of the benefits of working out the devices being smaller than 50 nm or even 1~2 nm, but none of better solution or effective technical breakthrough is proposed, announced or applied.

SUMMARY OF THE PRESENT INVENTION

The present invention originates a microminiaturizing method of nano-structure.

The prime object is to fabricate out a new nano-structure in more miniature manner than that of the current fabricating facilities by directly using the current fabricating facilities without any alteration or redesign of the precision;

And to promote and breakthrough the physical limit of the current fabricating facilities so that to achieve the re-microminiaturizing the variety of nano-device, nano-circuit and nano-wire etc.

The other object is to provide a microminiaturizing method of nano-structure with fabricating process steps as follows:

First deposit the material of molecule or atom state on the top-opening of the nano cylindrical pore, which having formed on the substrate, so that the diameter of said top-opening gradually reduce to become a reduced nano-aperture, whose opening diameter is smaller than that of said top-opening;

Then, directly pass the deposit material of gas molecule or atom state through said reduced nano-aperture; thereby a nano-structure of nano quantum dot, nano rod or nano ring with size under 60 nm is directly formed on the surface of said substrate, which being laid beneath the bottom of said nano cylindrical pore;

Thus, it cab be immediately adopted and directly applied in semiconductor industry to fabricate out more miniature industrial products or biomedical transducer/detector in miniature application.

BRIEF DESCRIPTION OF DRAWINGS

FIG. 9 is the first illustrative view showing the formation of reduced nano-aperture on the top of nano-cylindrical-pore according to another embodiment of the present invention.

FIG. 30 is the illustrative view showing the application of etchant (=etching material) through reduced nano-aperture according to the present invention.

FIG. 31 is the illustrative view showing the etching of nano-dented-dot on the surface of the substrate according to the present invention.

DETAILED DESCRIPTION OF THE PREFERRED EMBODIMENT

Figure 1:
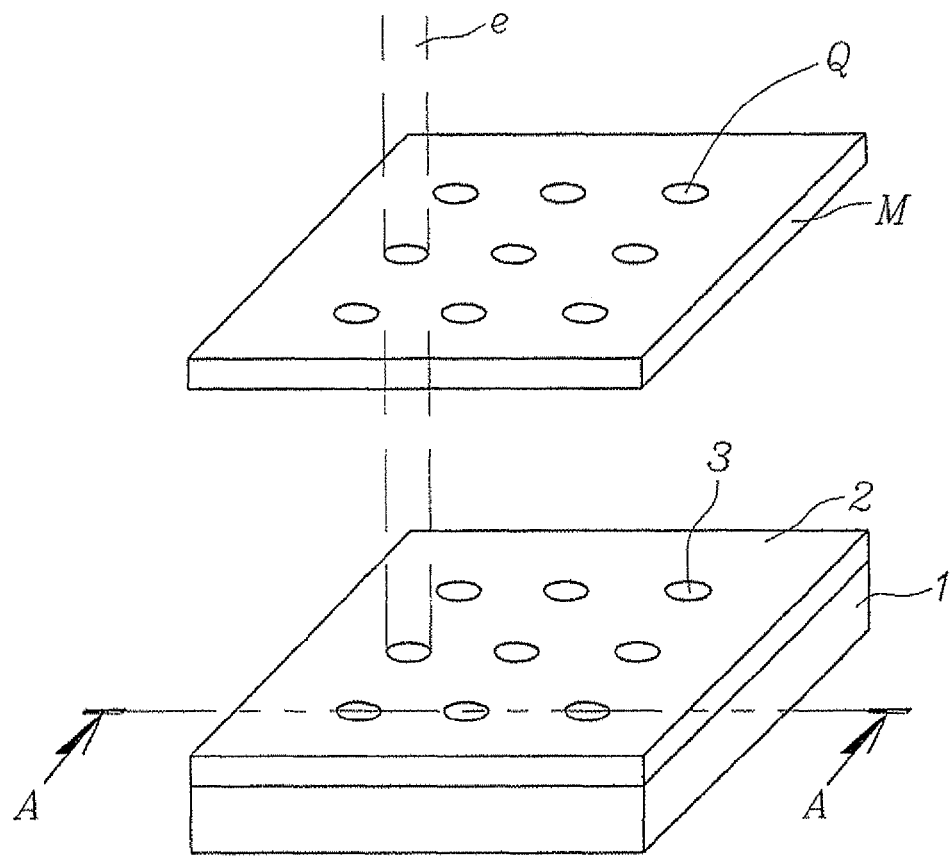
FIG. 1 is the perspective illustrative view showing the photomask and substrate according to conventional pattern transferring photolithography of nano-technological process.
Figure 2:
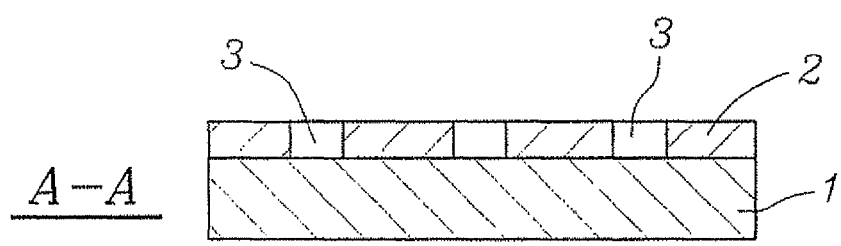
FIG. 2 is the cross sectional view taken on line A-A of FIG. 1.
Figure 3:
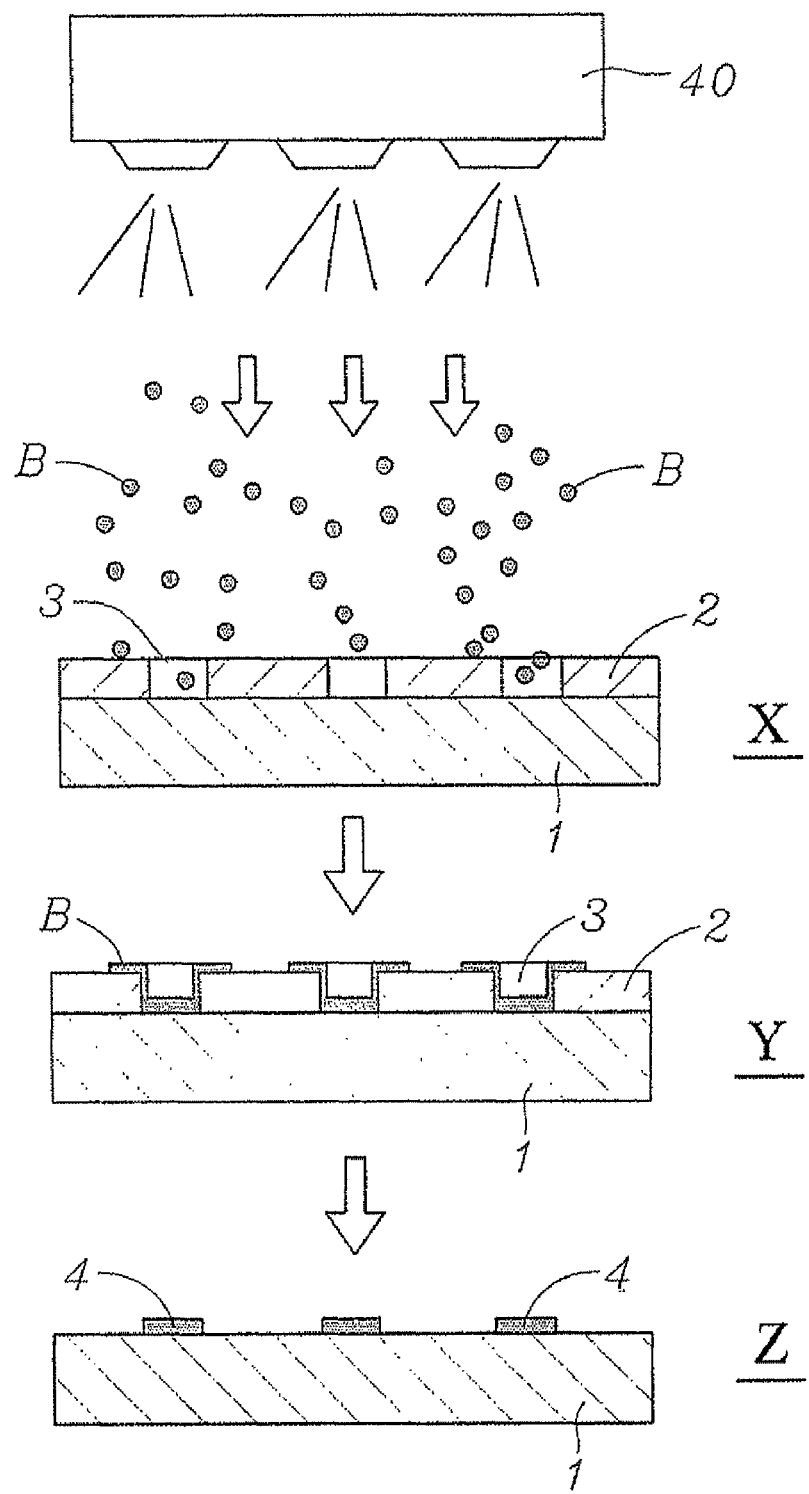
FIG. 3 is the flow chart showing the fabrication of nano-quantum-dot structure according to conventional nano-technology.
Figure 4:
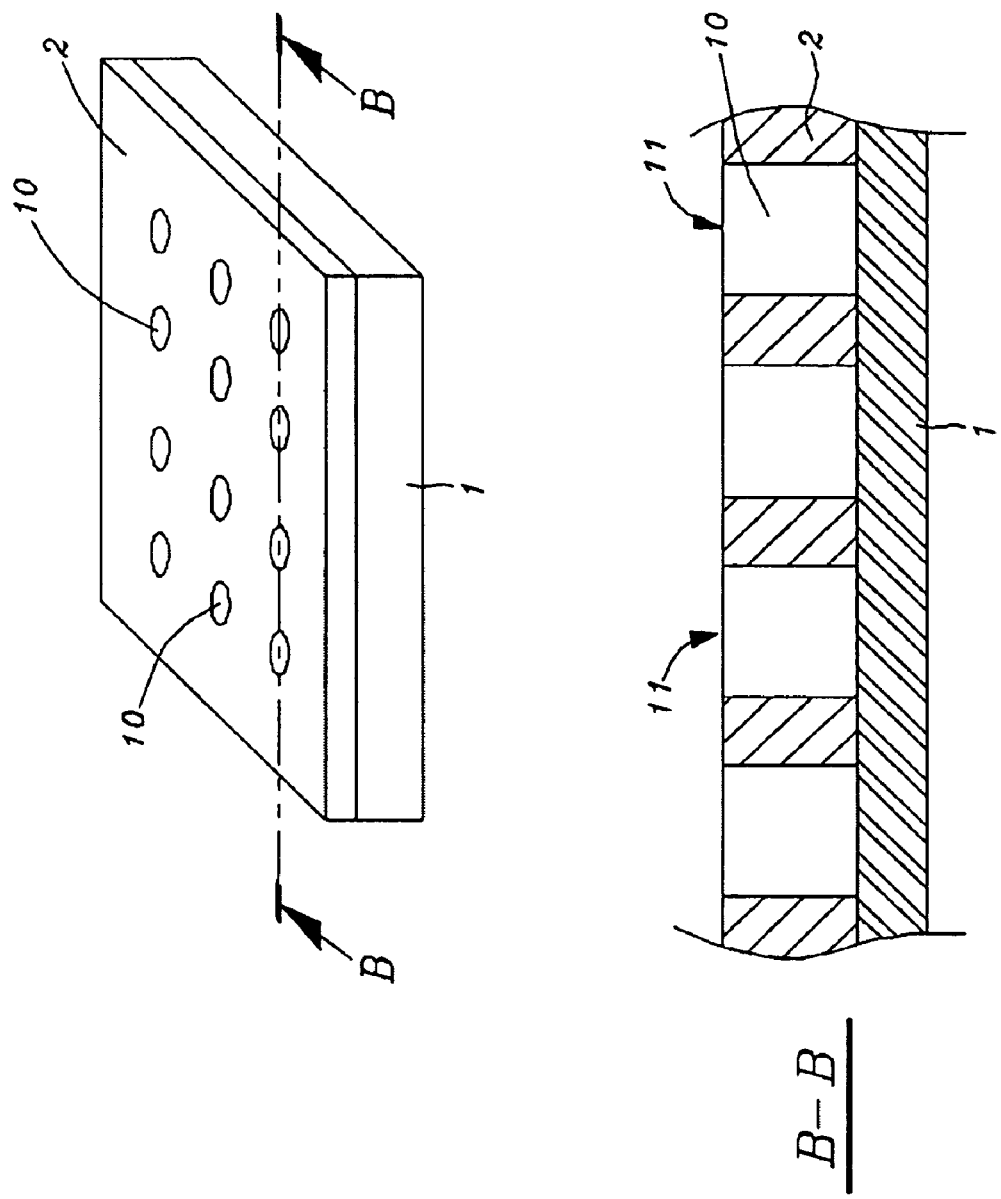
FIG. 4 is the perspective illustrative view showing the formation of nano-cylindrical-pore according to conventional build-up method or build-down method of nano-technological process.

Refer to FIG. 4, the existing nano cylindrical pore 10 is fabricated from conventional process in accordance with the build-up or build-down method;

The minimum size of said conventional nano cylindrical pore 10 is 60 nm or 60 nm over; The alternative to implement the fabricating process includes photolithography, nano-imprinting, MBE (Molecular Beam Epitaxy) and MOVCD (Metal-Organic Vapor phase Chemical Deposition in Epitaxy); However, the ways of these conventional technologies aforesaid are not detailed described here as their feature and know-how being not aspired after by the present invention.

Refer to FIG. 4 through FIG. 8, the process steps of "a microminiaturizing method of nano-structure" in accordance with the present invention comprise:

(a): First deposit the sealant(=sealing material) A of gas molecule or atom state on the top-opening 11 of the nano cylindrical pore 10, which having formed on the photo-resist 2 of the substrate 1 (as shown in B-B view of the FIG. 4), so that the diameter of said top-opening 11 gradually reduce to become a reduced nano-aperture 20, whose opening diameter is smaller than that of said top-opening 11 (as shown in g view of the FIG. 5 and FIG. 6);

(b): Directly pass the deposit material B of gas molecule or atom state through said reduced nano-aperture 20 (as shown in the FIG. 7 and a view of FIG. 8);

Thus a nano quantum dot 30 with diameter being same as that of said reduced nano-aperture 20 is directly formed on the surface of said substrate 1, which being laid beneath the bottom of said nano cylindrical pore 10 (as shown in a, b, c and d views of FIG. 8); and (c): By means of solution rinsing (i.e. wet etching) or gas etching (i.e. dry etching), remove said nano cylindrical pore 10 in said photo-resist 2 on said substrate 1, thereby a nano quantum dot 30 structure with smaller nano-scale is directly formed on the surface of said substrate 1 (as shown in e views of FIG. 8 and corresponding top view).

Figure 5:
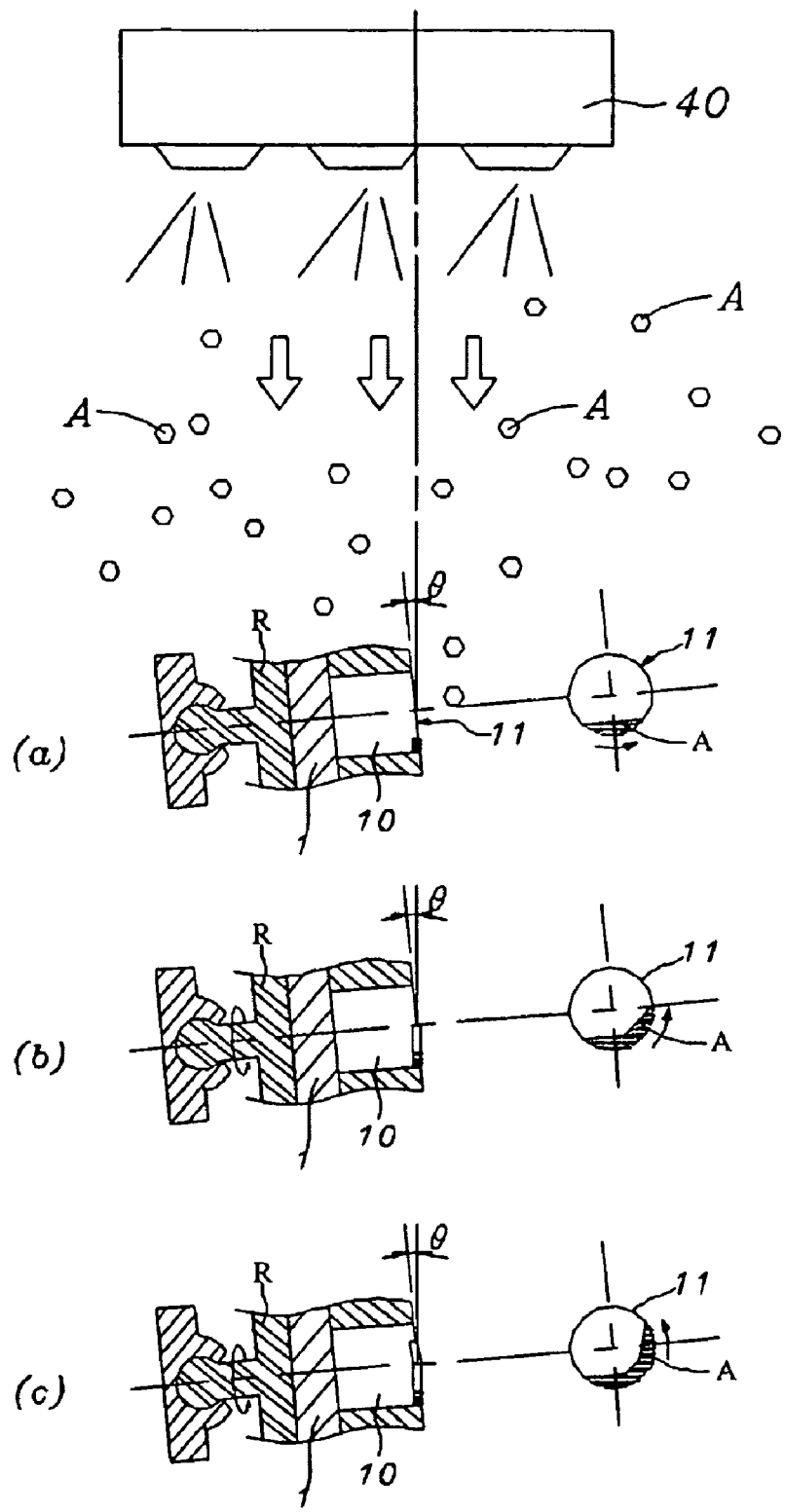
FIG. 5 is the illustrative flow chart showing the formation of reduced nano-aperture on the top of nano-cylindrical-pore according to the present invention.
Figure 5:
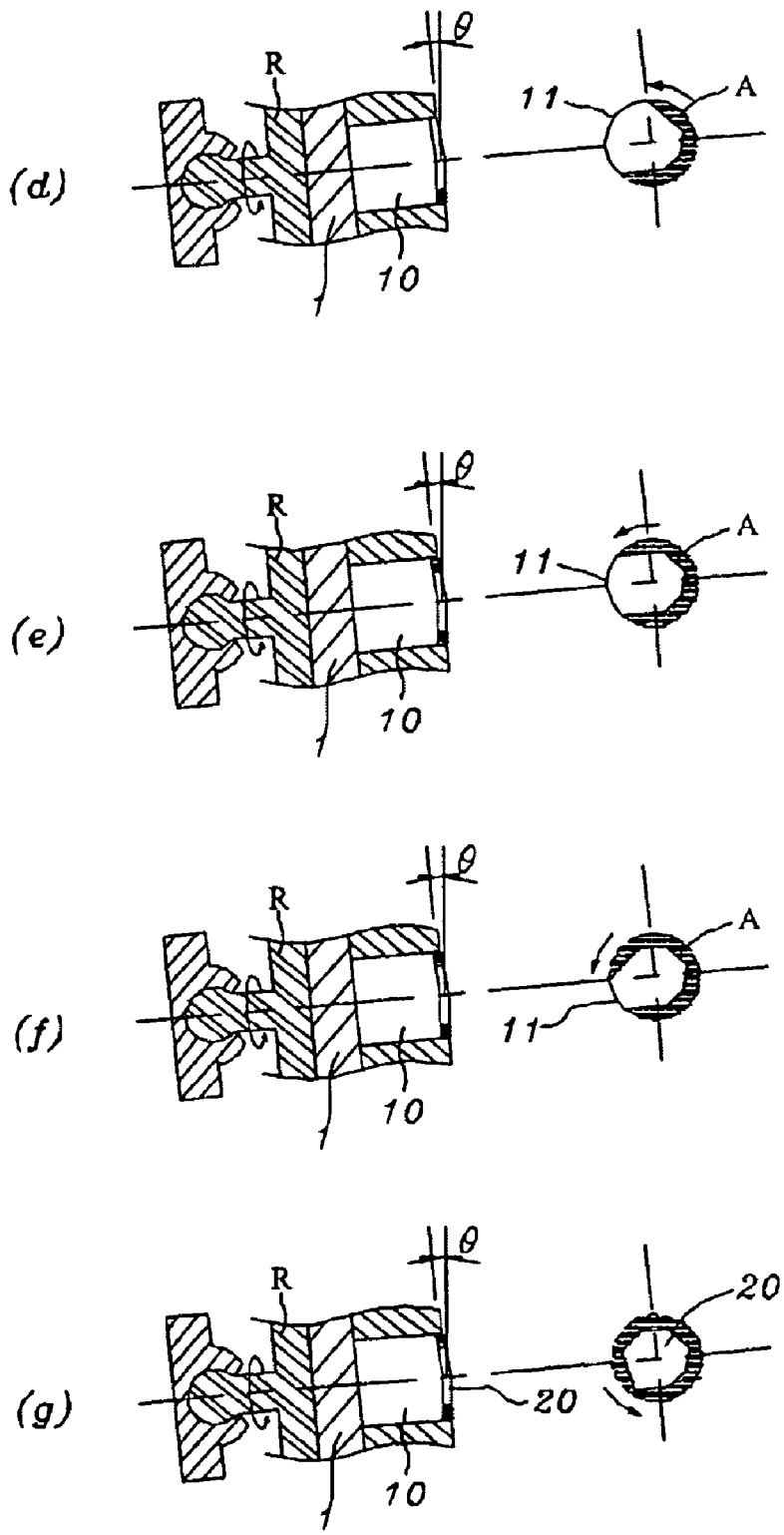
Figure 6:
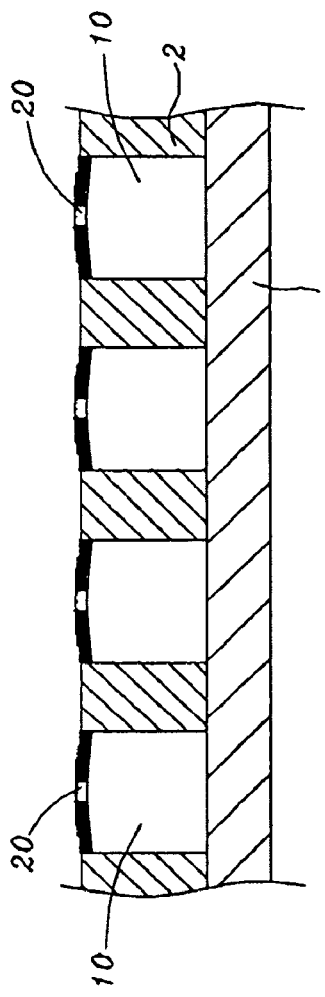
FIG. 6 is the cross sectional illustrative view showing the completion of reduced nano-aperture on the top of nano-cylindrical-pore according to the present invention.
Figure 8:
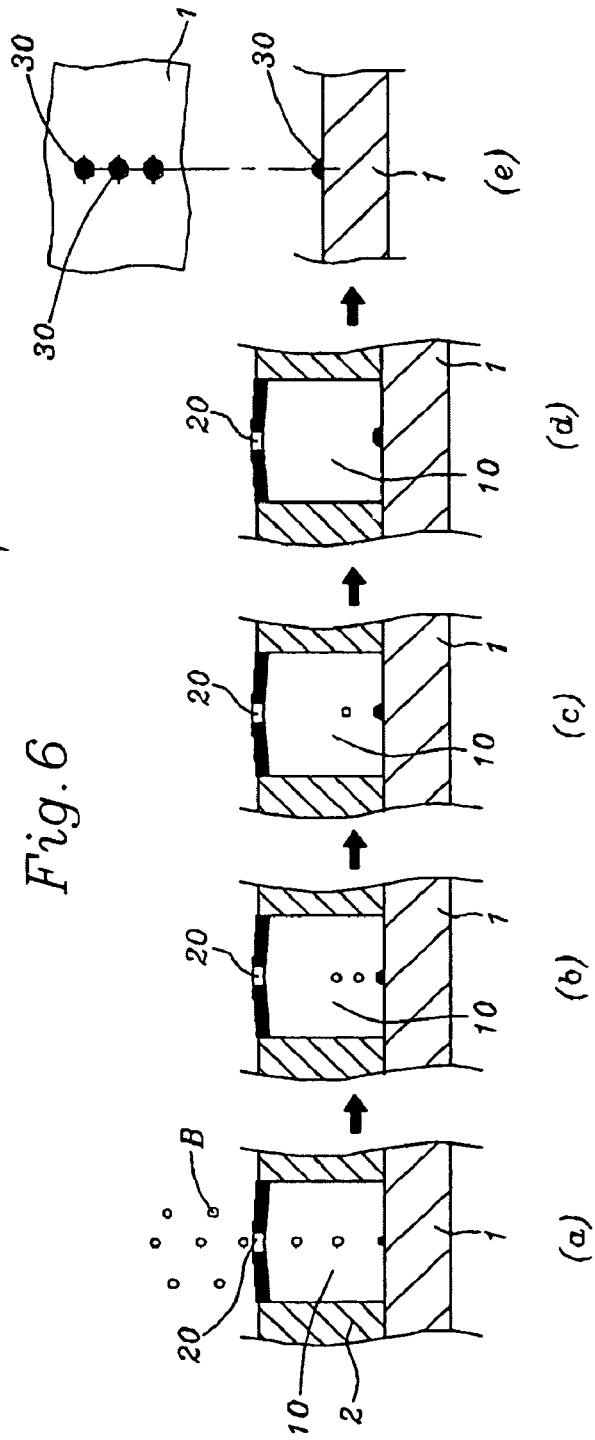
FIG. 8 is the operation illustrative view showing the growth of nano-quantum-dot on the surface of the substrate according to the present invention.
Figure 7:
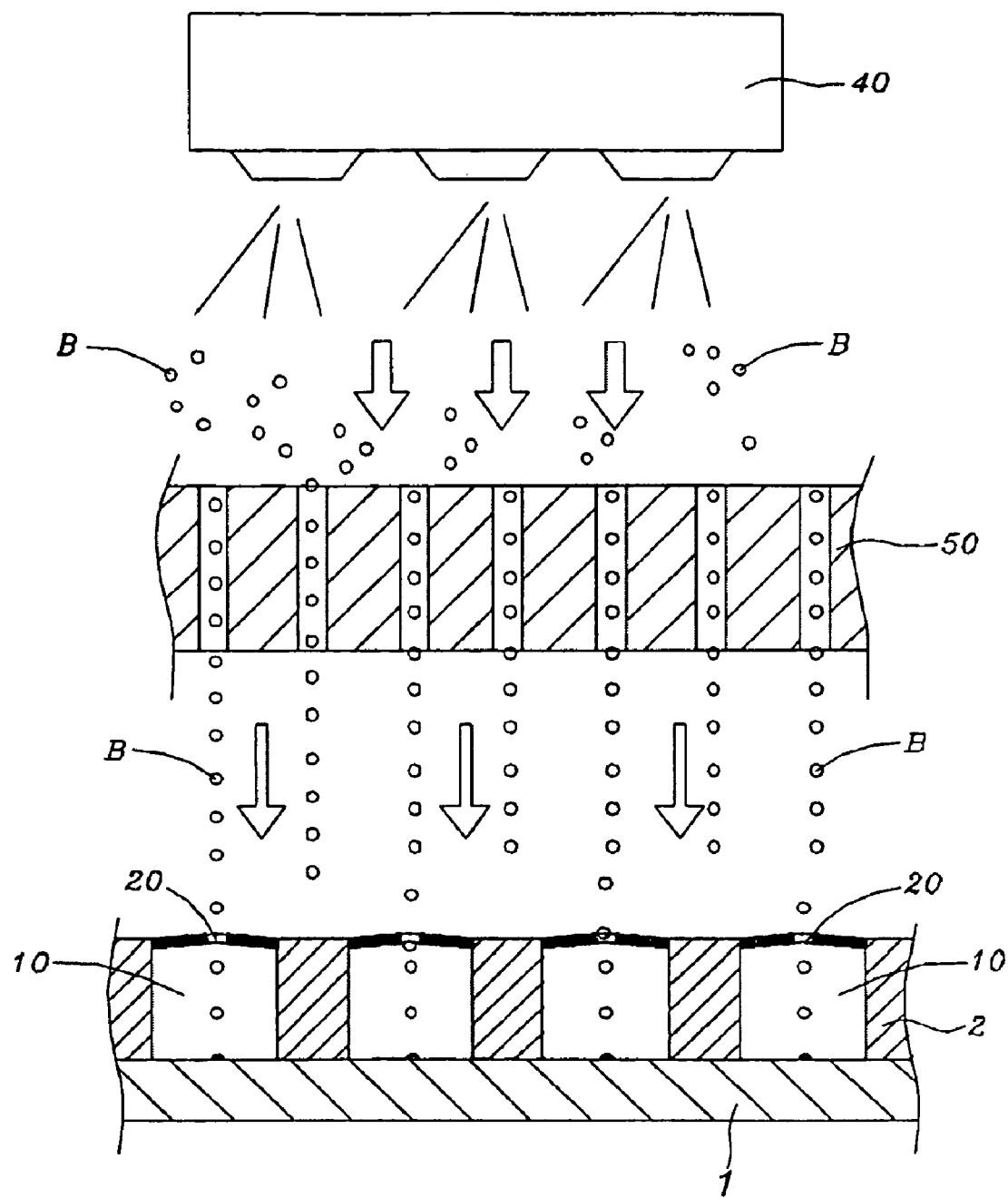
FIG. 7 is the operation illustrative view showing the formation of nano-quantum-dot through the reduced nano-aperture according to the present invention.
Figure 10:
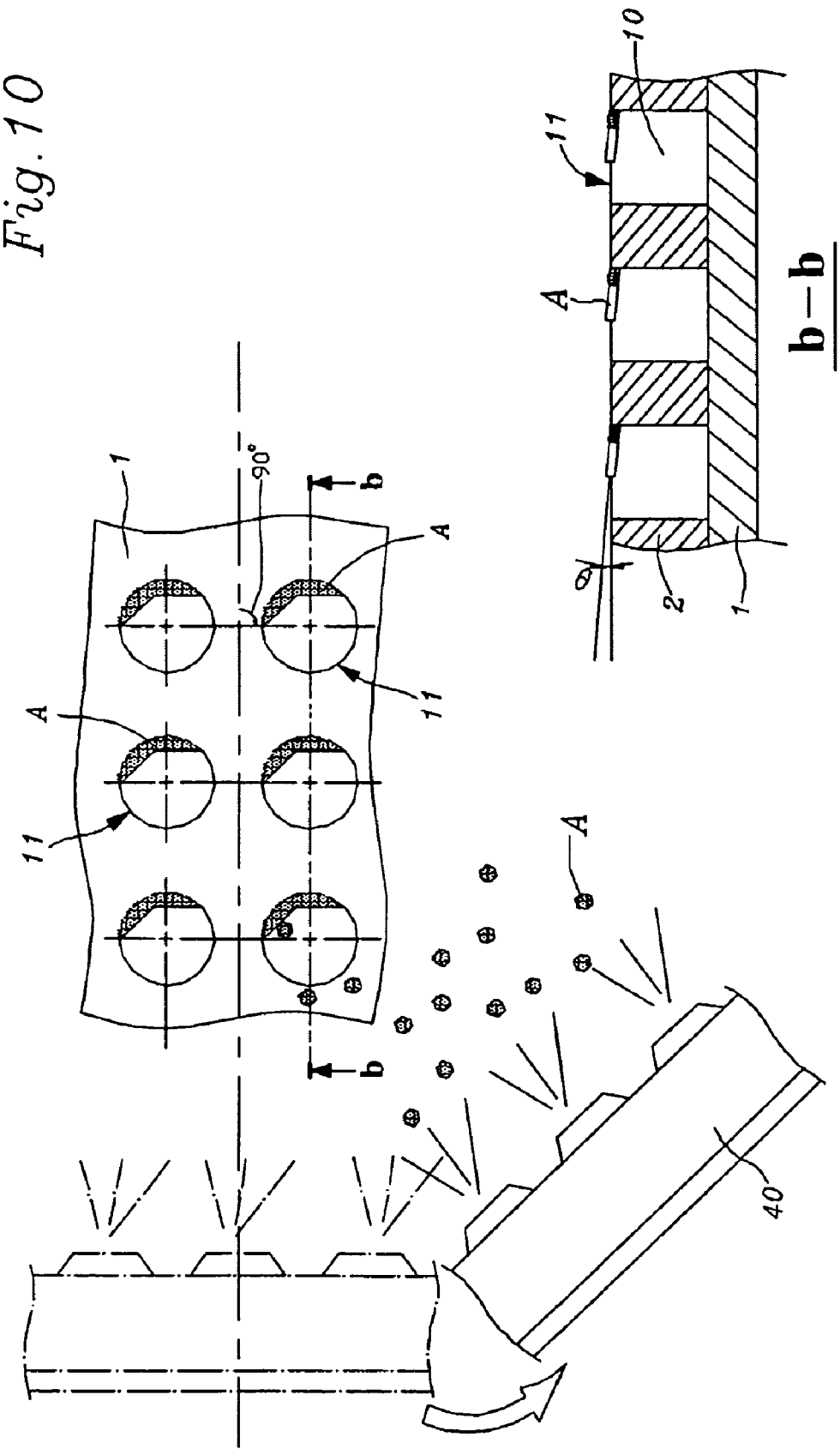
FIG. 10 is the second illustrative view showing the formation of reduced nano-aperture on the top of nano-cylindrical-pore according to another embodiment of the present invention.
Figure 11:
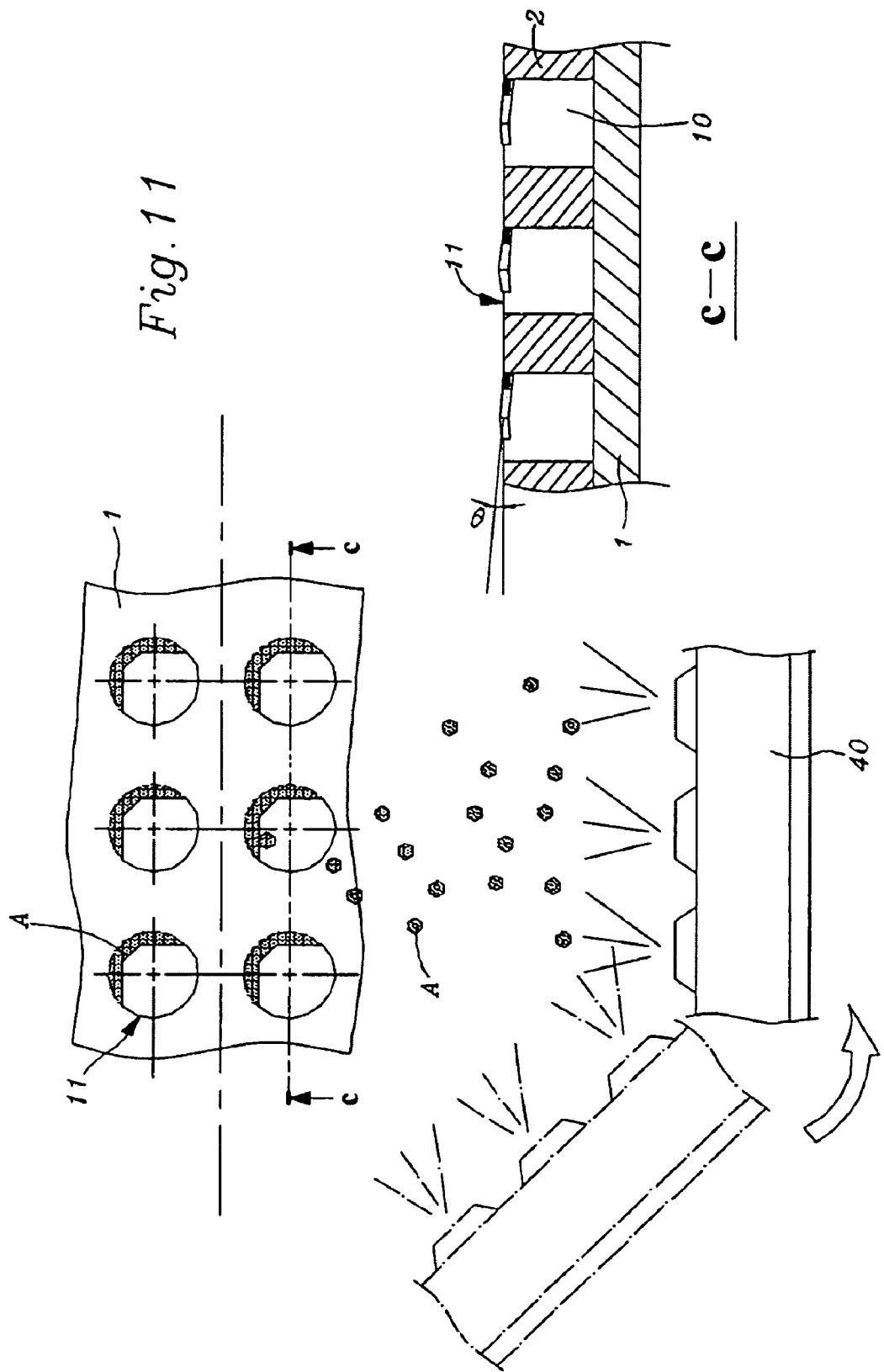
FIG. 11 is the third illustrative view showing the formation of reduced nano-aperture on the top of nano-cylindrical-pore according to another embodiment of the present invention.
Figure 12:
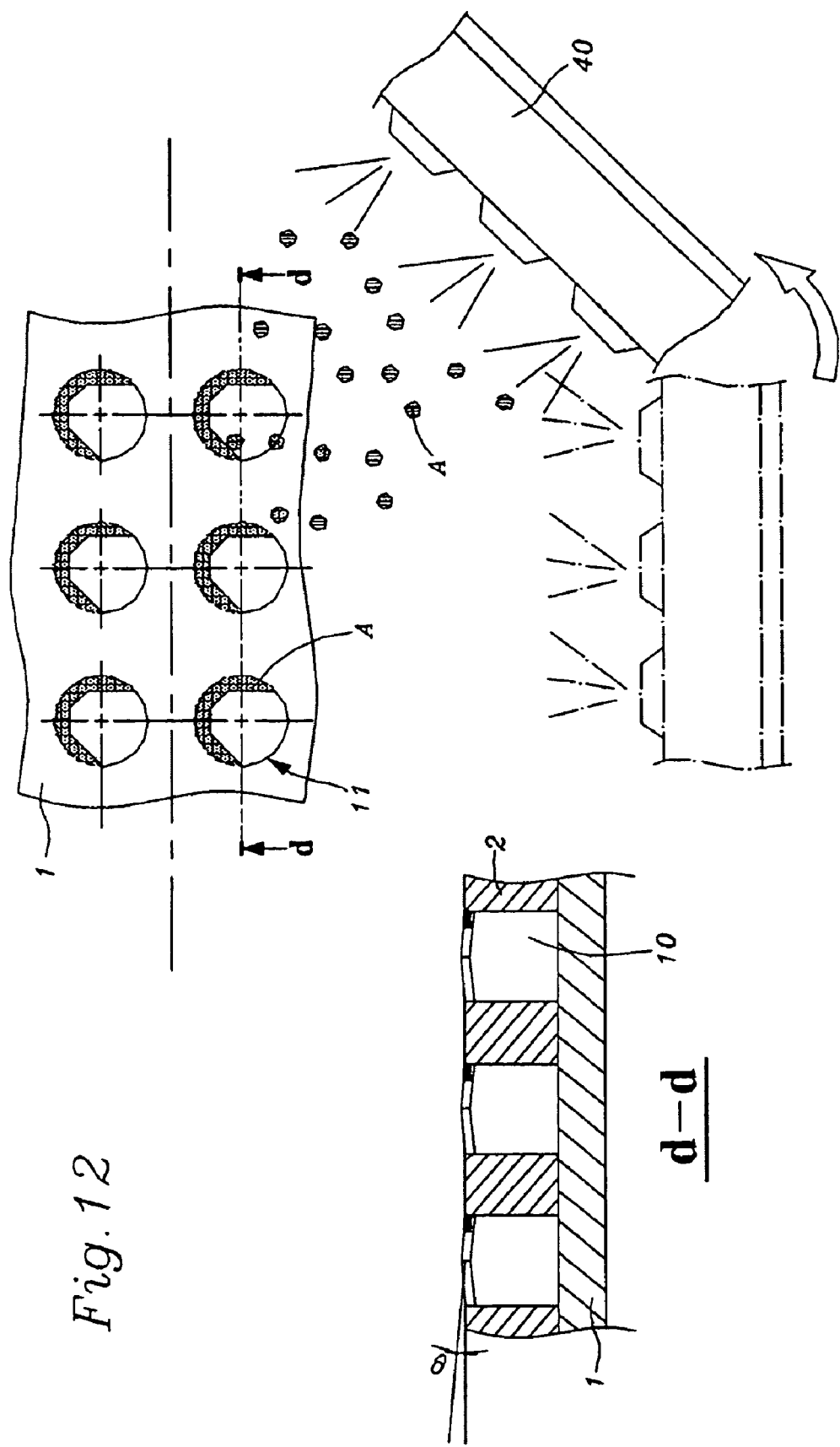
FIG. 12 is the fourth illustrative view showing the formation of reduced nano-aperture on the top of nano-cylindrical-pore according to another embodiment of the present invention.
Figure 13:
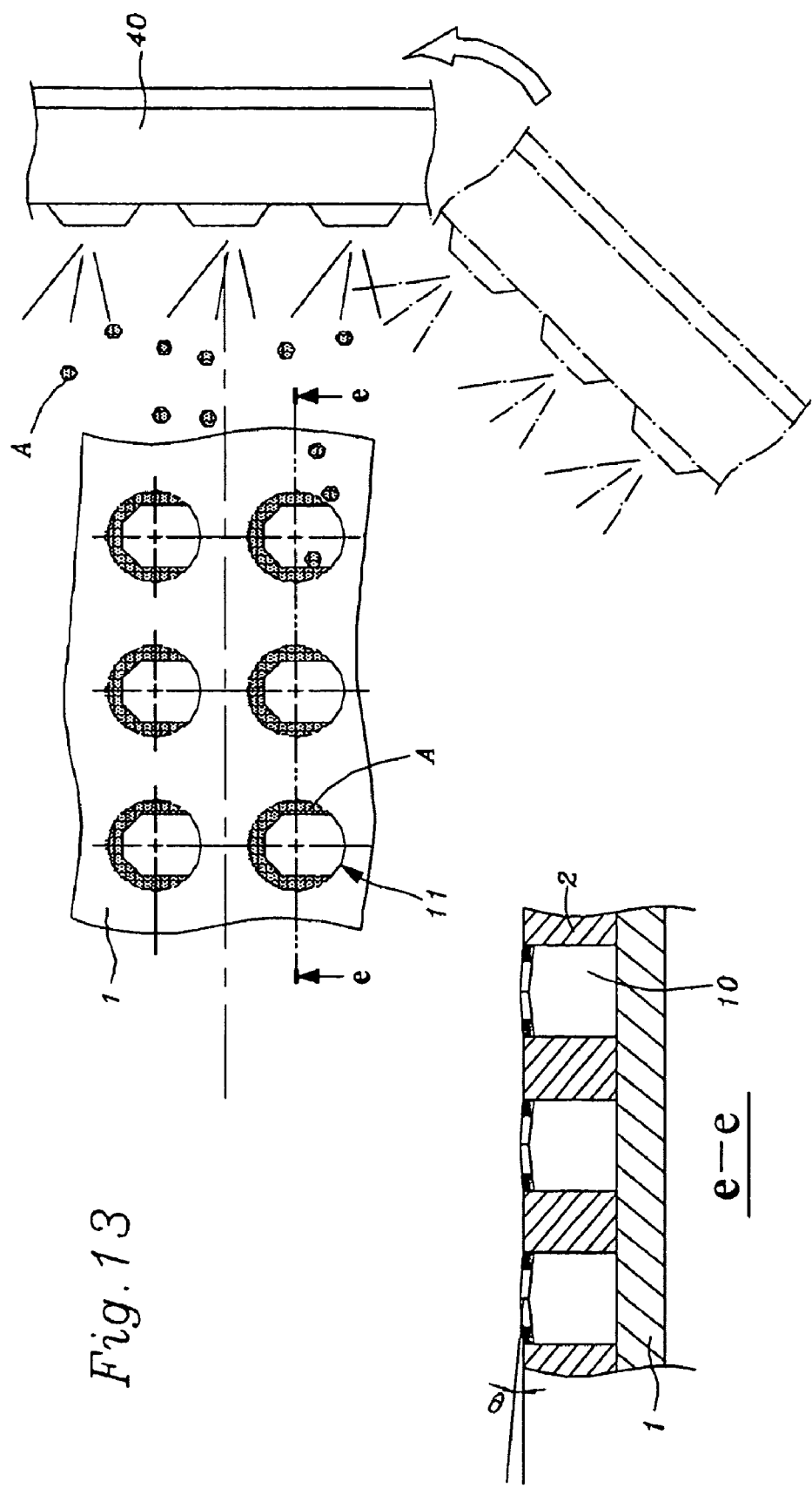
FIG. 13 is the fifth illustrative view showing the formation of reduced nano-aperture on the top of nano-cylindrical-pore according to another embodiment of the present invention.
Figure 14:
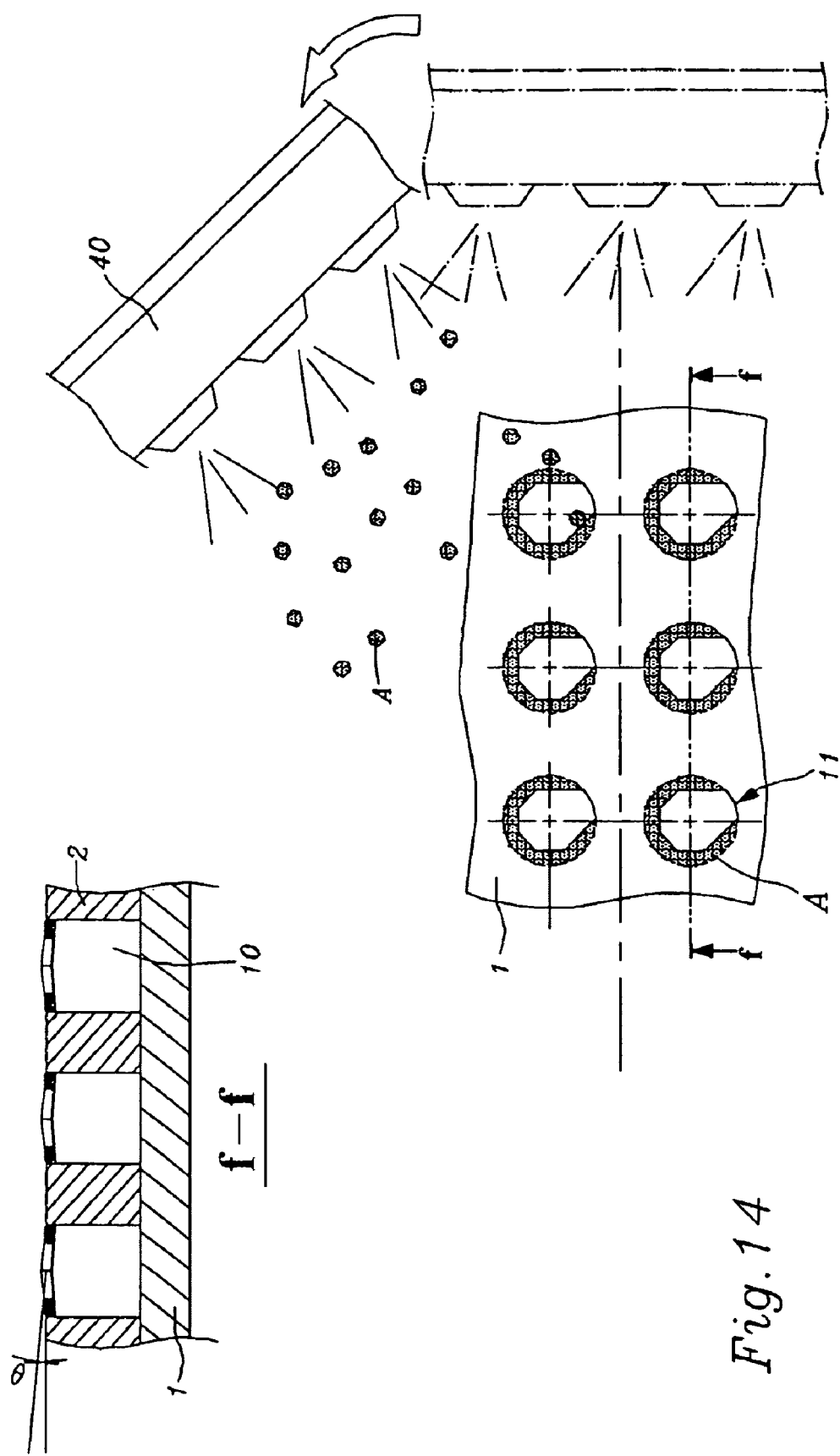
FIG. 14 is the sixth illustrative view showing the formation of reduced nano-aperture on the top of nano-cylindrical-pore according to another embodiment of the present invention.
Figure 15:
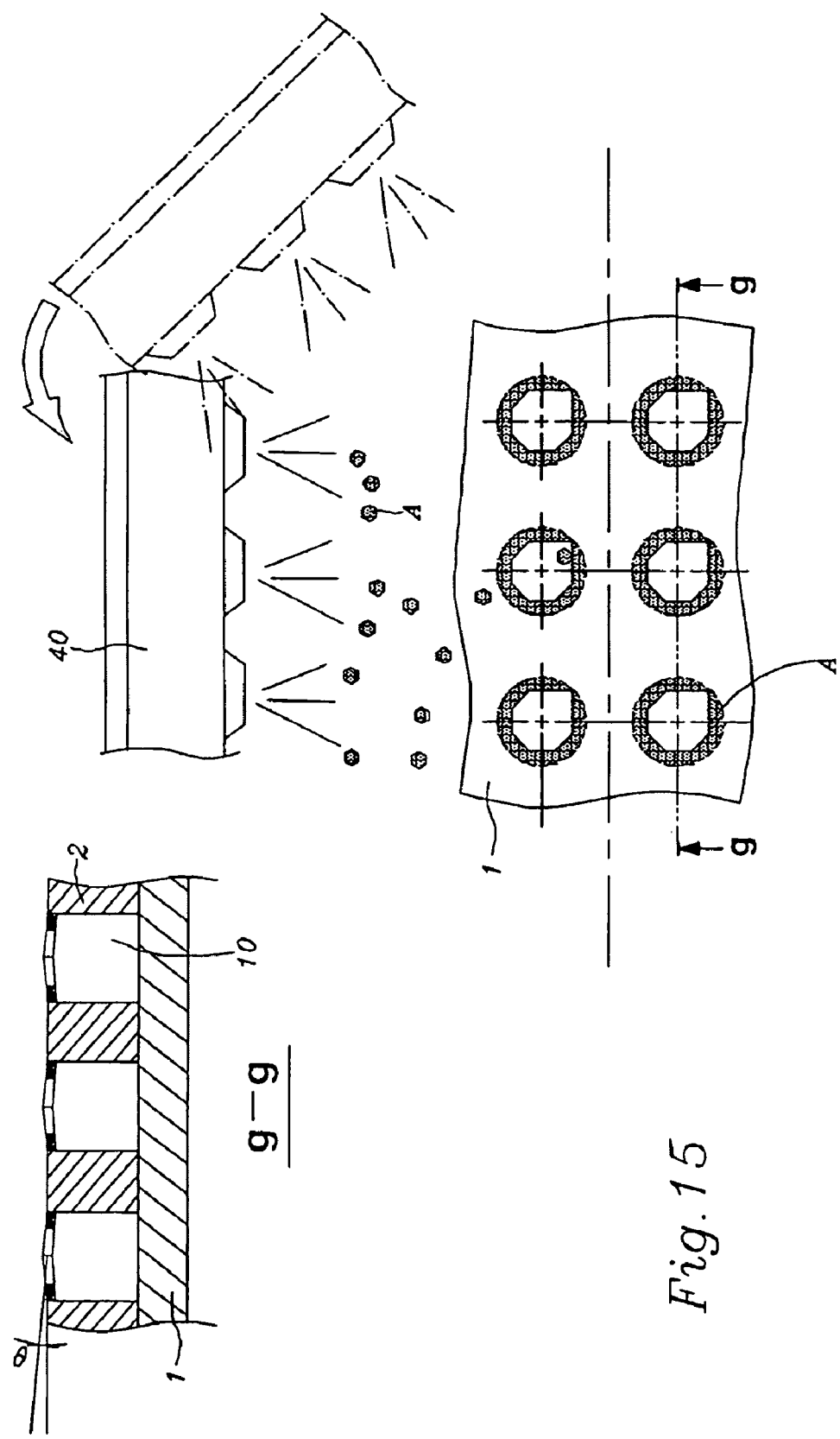
FIG. 15 is the seventh illustrative view showing the formation of reduced nano-aperture on the top of nano-cylindrical-pore according to another embodiment of the present invention.

Wherein, the sub-steps of performing the aforesaid step (a) in forming said reduced nano-aperture 20 on said top-opening 11 of said nano cylindrical pore 10 comprise (as shown in FIG. 5):

(1): First firmly place said substrate 1 on the tilt-rotary console R with capability of 3-D tilt and rotation and adjust said tilt-rotary console R in tilt angle θ (as shown in a view of the FIG. 5), namely the included angle value of the central line of said top-opening 11 of said nano cylindrical pore 10 and the output direction of said deposit source device 40 is (90°-θ); so that said sealing material A of gas molecule or atom state can partially deposit on the end rim of said top-opening 11 of said nano cylindrical pore 10 (as shown in a view of FIG. 5 and corresponding view marked with A); and (2): Let said tilt-rotary console R keep in tilt angle θ inclination, and gradually rotate it one complete rotation (as respectively shown in b, c, d, e, f view and each of corresponding lateral views of the FIG. 5), thereby a reduced nano-aperture 20 with diameter being smaller than that of said top-opening 11 is formed on said top-opening 11 of said nano cylindrical pore 10 by deposition of said (sealant(=sealing material) A of gas molecule or atom state (as shown in g view and corresponding lateral view of the FIG. 5).

In aforesaid sub-step (2), the rotational number of said tilt-rotary console R can be increased so as to get smaller orifice diameter in said reduced nano-aperture 20; Besides, the size of the orifice diameter in said reduced nano-aperture 20 can be real-time monitored by membrane thickness meter to serve as basis in control the rotational speed of said tilt-rotary console R; Thus, the expected subsequent nano-structure of said nano quantum dot 30 in various specifications can be conformed in consequence of the expected size of the orifice diameter in said reduced nano-aperture 20 can be achieved in this way.

Moreover, the aforesaid step (a) in the fabricating method of forming reduced nano-aperture 20 on said top-opening 11 of said nano cylindrical pore 10 can be replaced by keeping substrate 1 still and revolving the deposit source device 40 around said substrate 1 one complete revolution so as to have the same achievement.

Figure 16:
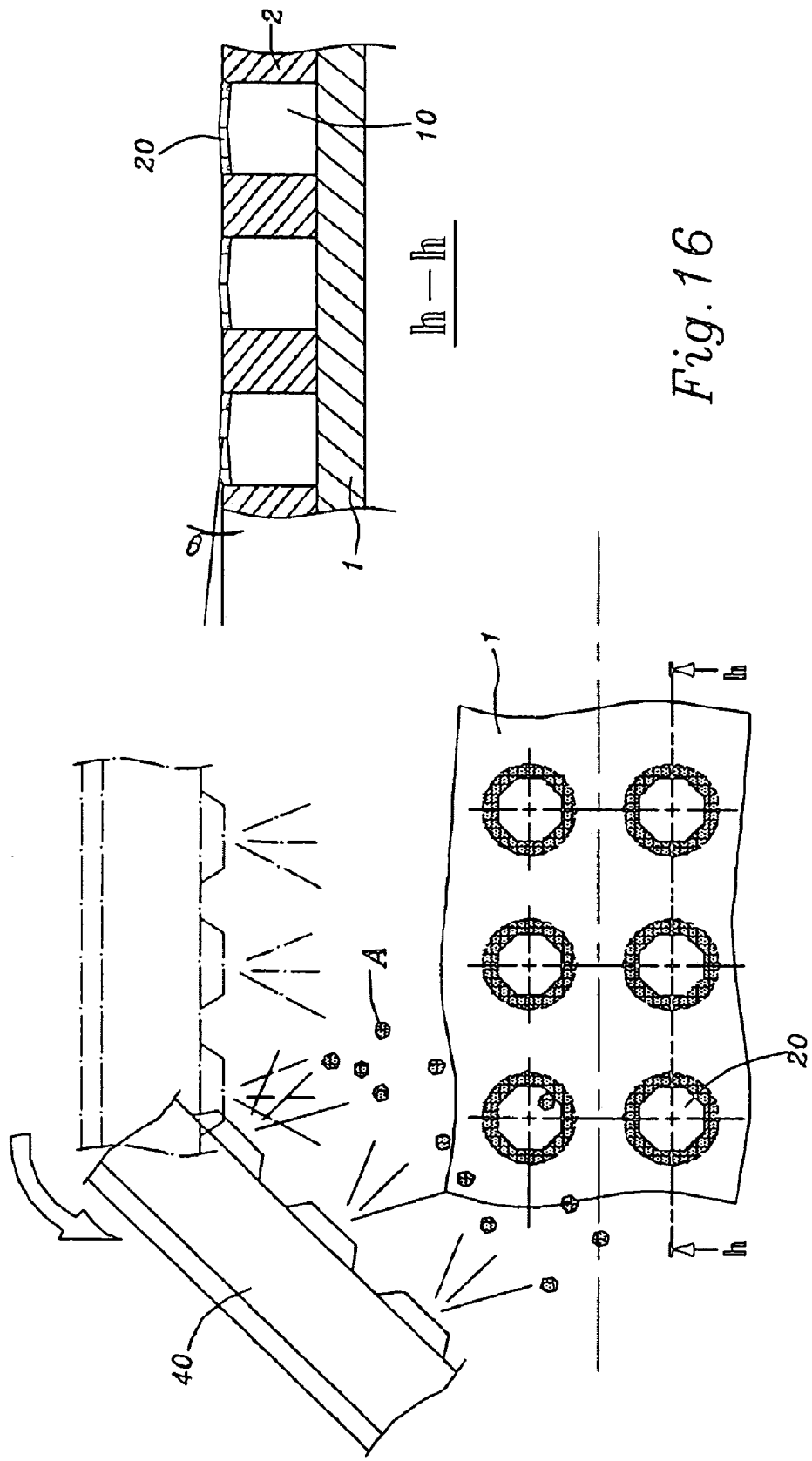
FIG. 16 is the eighth illustrative view showing the formation of reduced nano-aperture on the top of nano-cylindrical-pore according to another embodiment of the present invention.

Refer to FIG. 9 through FIG. 16, the process steps comprise:

(1): Keep said substrate 1 in horizontal direction such that direction of said top-opening 11 on said nano cylindrical pore 10 faces upwards vertically, align and tilt said deposit source device 40 to face towards said top-opening 11 such that the included angle of each other becomes a tilt angle θ (as shown in a-a view of the FIG. 9); Thereby, said (sealant(=sealing material) A of gas molecule or atom state can partially deposit on the farther rim relative to of said deposit source device 40 of said top-opening 11 (as shown in a-a view of the FIG. 9 and corresponding top view); and (2): Keep said deposit source device 40 in said tilt angle θ and revolve around said substrate 1 as center one complete revolution (as shown in FIG. 10 through FIG. 16 and each of corresponding cross sectional view b-b, c-c, d-d, f-f, g-g, h-h);

Thereby the reduced nano-aperture 20 with orifice diameter being smaller than that of said top-opening 11 can be formed on said top-opening 11 of said nano cylindrical pore 10 by deposition of said (sealant(=sealing material) A of gas molecule or atom state (as shown in the FIG. 16 and corresponding h-h cross sectional view).

Furthermore, the output of said deposit material B of gas molecule or atom state in step (a) aforesaid is supplied by said deposit source device 40; In order to regulate said deposit material B of gas molecule or atom state to pass through said reduced nano-aperture 20 in manner of straight line path, a collimator 50 can be installed between said deposit source device 40 and said reduced nano-aperture 20 (as shown in the FIG. 7) so that the moving direction of said deposit material B of gas molecule or atom state becomes more coherent;

Thus, the reliability of nano quantum dot 30 forming on the surface of said substrate 1 is enhanced.

Therefore, the nano-structure of said nano quantum dot 30 fabricated by the aforesaid process steps (a), (b) and (c) is a nano bulged dot being formed by the deposition of said deposit material B of gas molecule or atom state on the surface of said substrate 1 through passing said reduced nano-aperture 20 on said nano cylindrical pore 10; The circumferential shape of said nano quantum dot 30 is surrounded by link of irregular curves, and its size is same as said orifice diameter of said reduced nano-aperture 20;

Consequently, the size in nano-scale of said nano quantum dot 30 formed on said substrate 1 is definitely smaller than that of said nano cylindrical pore 10 as said orifice diameter of said reduced nano-aperture 20 is smaller than that of said nano cylindrical pore 10;

For example, let the nano-scale of nano cylindrical pore 10 is 60 nm, and the orifice diameter of said reduced nano-aperture 20 formed by having reduced on said top-opening 11 is 10 nm; Then, the final size in nano-scale of said nano quantum dot 30 formed on said substrate 1 is 10 nm; Thus, the aforesaid fabricating process can indeed achieve the result of microminiaturizing the existing nano-structure.

Figure 17:
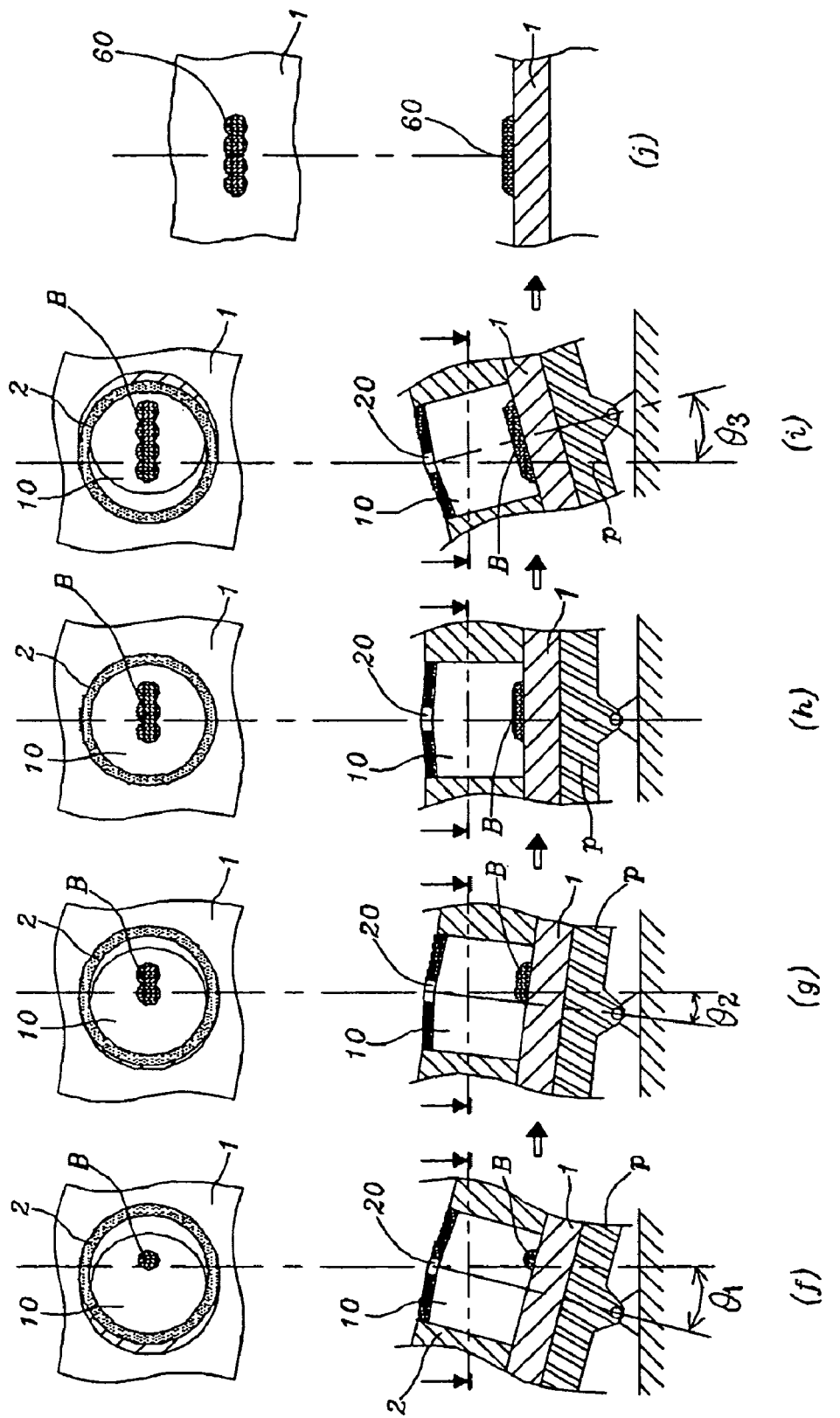
FIG. 17 is the illustrative flow chart showing the growth of nano-rod on the surface of the substrate according to the present invention.

As shown in the FIG. 17 is the second embodiment of the present invention in fabricating a nano rod 60 in more microminiaturizing manner.

In this fabricating process, the substrate 1 is firmly placed on the rotary console P with capability of 2-D leftwards and rightwards tilt and one-by-one orderly adjust the leftwards and rightwards tilt angle θ of said rotary console P as θ1, θ2 and θ3 etc. (as shown in f, g, h, i view of the FIG. 17 and each of corresponding top view);

Thereby the deposit material B of molecule or atom state passing through said reduced nano-aperture 20 will one-by-one continuously form a nano rod 60, whose width being smaller than that of the orifice diameter in nano cylindrical pore 10, on the surface of said substrate 1 (as shown in j view of the FIG. 17 and corresponding top view);

Therefore, the structure of said nano rod 60 is a bulged rod, which is formed on said substrate 1 by deposition of said deposit material B of molecule or atom state through one-by-one continuously adjusting said reduced nano-aperture 20 in different tilt angles θ; Thus, its maximum width of the bulged rod is equivalent to or less than the orifice diameter of said reduced nano-aperture 20, and both sides of the rod is shaped by link of irregular lines (as shown in j view of the FIG. 17 and corresponding top view).

Figure 18:
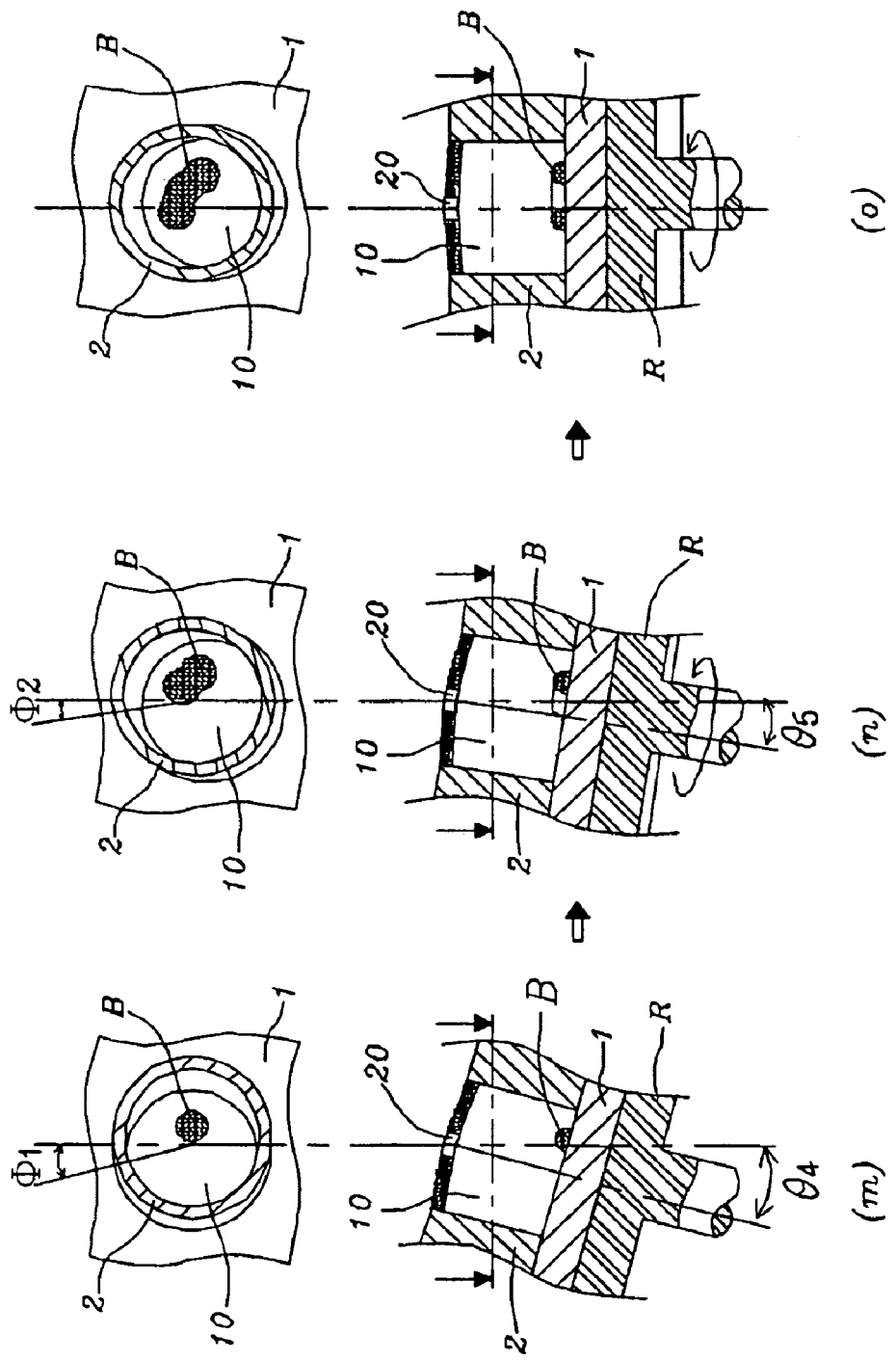
FIG. 18 is the illustrative flow chart showing the growth of nano-ring on the surface of the substrate according to the present invention.
Figure 18:
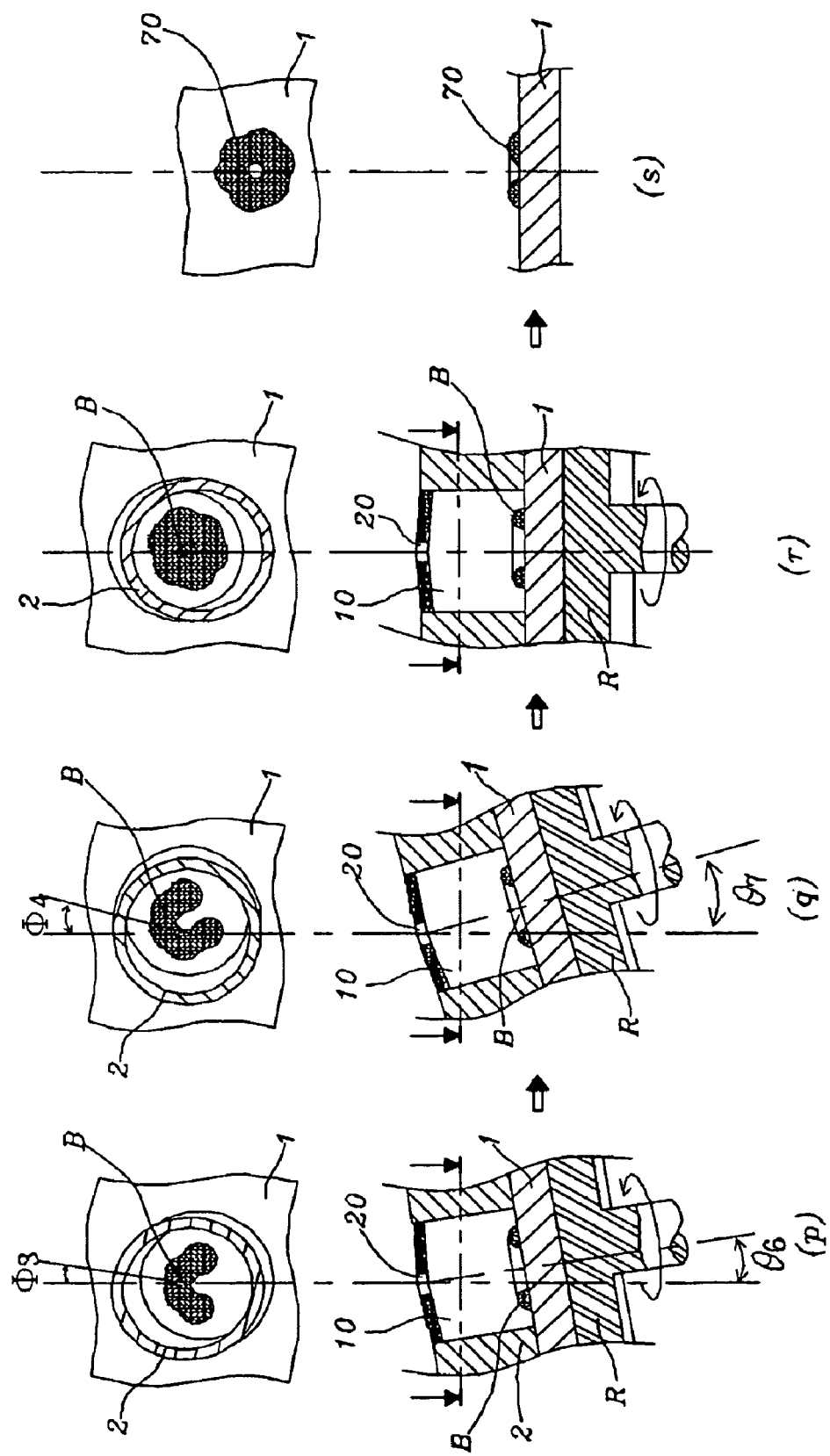

As shown in the FIG. 18 is the third embodiment of the present invention in fabricating a nano ring 70 in more microminiaturizing manner.

In this fabricating process, the substrate 1 is firmly placed on the tilt-rotary console R with capability of 3-D tilt and rotation and one-by-one orderly adjust said the rotation angle Φ of said tilt-rotary console R as Φ1, Φ2, Φ3 and Φ4 etc. as well as in coordination with forwards and backwards tilt angle θ plus leftwards and rightwards yaw angle θ as θ4, θ5, θ6 and θ7 etc. (as shown in m, n, o, p, q, r, s view of the FIG. 18 and each of corresponding top view);

Thereby the deposit material B of molecule or atom state passing through said reduced nano-aperture 20 will one-by-one continuously form a nano ring 70, whose size being smaller than that of the orifice diameter in nano cylindrical pore 10, on said substrate 1 (as shown in s view of the FIG. 18 and corresponding top view);

Therefore, the structure of said nano ring 70 is a bulged ring, which is formed on said substrate 1 by deposition of said deposit material B of molecule or atom state through one-byone continuously adjusting said reduced nano-aperture 20 in different tilt angles θ and rotation angle Φ; Thus, its maximum outer diameter of the bulged ring is equivalent to or less than the orifice diameter of said reduced nano-aperture 20, and both sides of the bulged ring is surrounded by link of irregular curves (as shown in s view of the FIG. 18 and corresponding top view).

Figure 19:
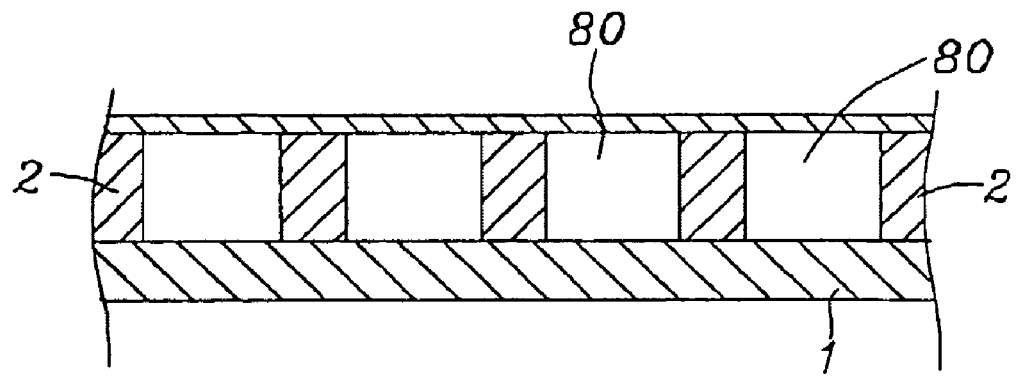
FIG. 19 is the illustrative view showing the nano-cylindrical-pore with closed top according to the present invention.
Figure 20:
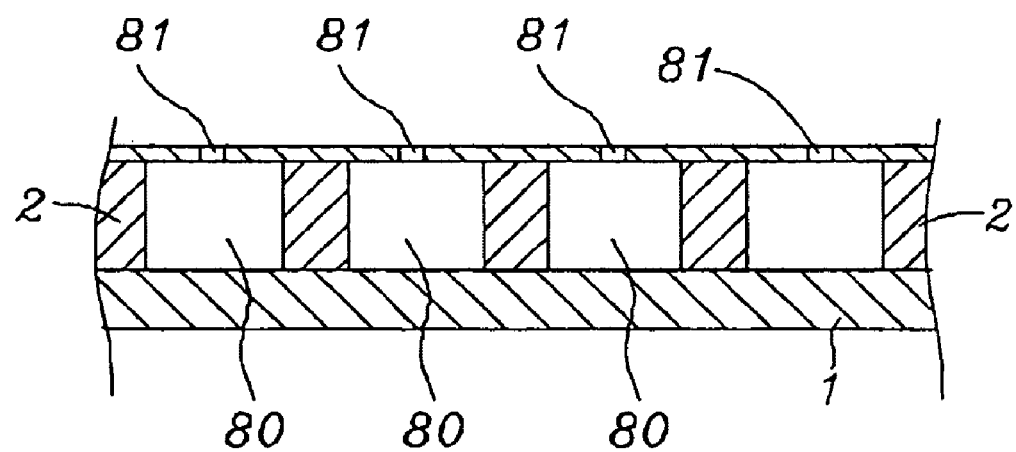
FIG. 20 is the first view of illustrative flow chart according to another embodiment of the present invention.
Figure 21:
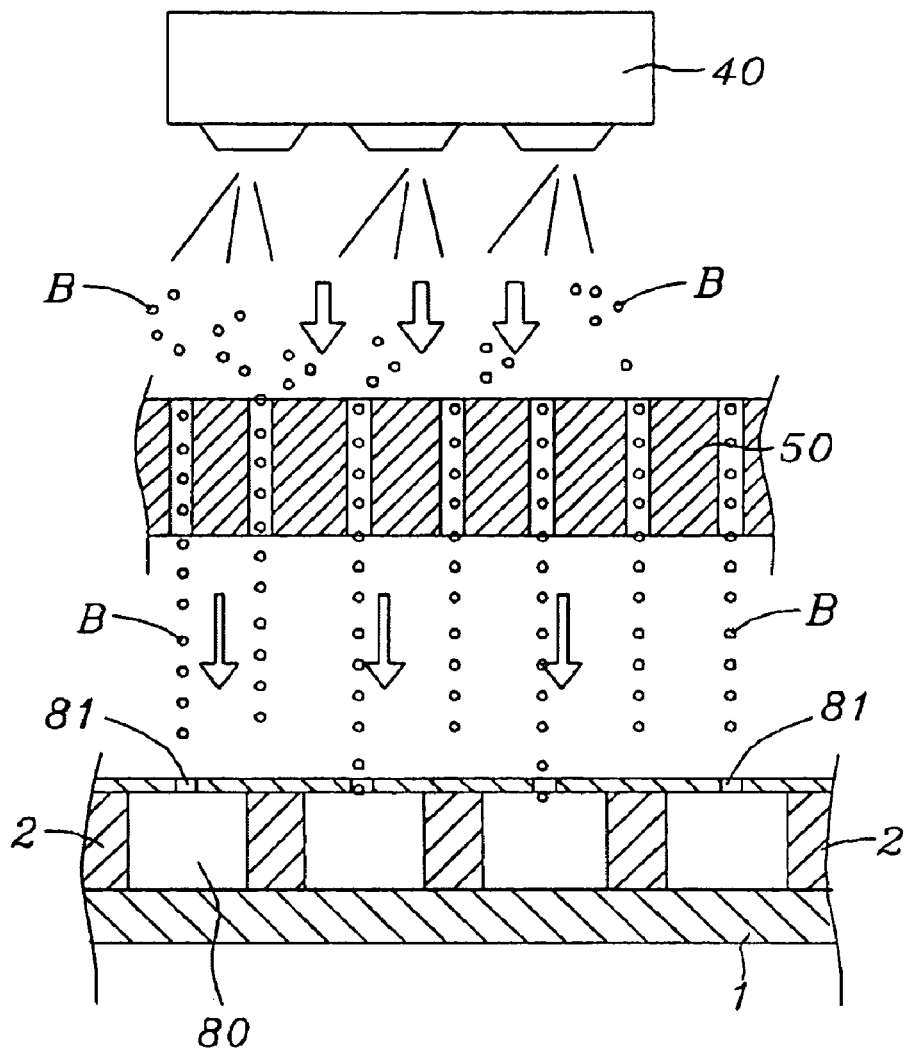
FIG. 21 is the second view of illustrative flow chart according to another embodiment of the present invention.
Figure 22:
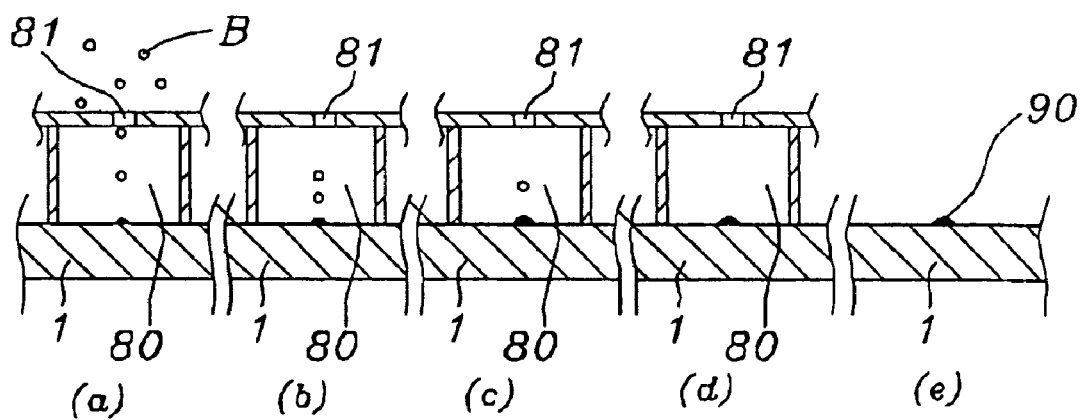
FIG. 22 is the third view of illustrative flow chart according to another embodiment of the present invention.

As shown in the FIG. 19 through FIG. 22 is the fourth embodiment of the present invention in fabricating a nano structure with closed top on the nano cylindrical pore 80, which is existing pattern formed on said photo-resist 2 of said substrate 1 (as shown in the FIG. 19).

The fabricating process steps comprise:
- (a): By means of etching from solution or sputtering from high energy gas particle, first drill a nano orifice 81 on the top of nano cylindrical pore 80 with closed top (as shown in the FIG. 20);
- (b): Directly pass the deposit material B of gas molecule or atom state through the nano orifice 81 (as shown in the FIG. 21); Thereby the nano quantum dot 90 with same nano-scale as the orifice diameter of said nano orifice 81 is directly formed on said substrate 1, which being laid beneath the bottom of said nano cylindrical pore 80 (as shown in a, b, c and view of the FIG. 22); and
- (c): By means of solution rinsing (i.e. wet etching) or gas etching (i.e. dry etching), remove said nano cylindrical pore 80 in said photo-resist 2 on said substrate 1, thereby a nano quantum dot 90 structure with smaller nano-scale is directly formed on the surface of said substrate 1 (as shown in e views of FIG. 22).

Wherein, aforesaid process steps (a), (b) and (c) in fabricating the nano-structure of said nano quantum dot 90 can be modified in coordination with aforesaid embodiments to fabricate out the nano-structure of nano rod 60 or nano ring 70 in same manner.

Figure 23:
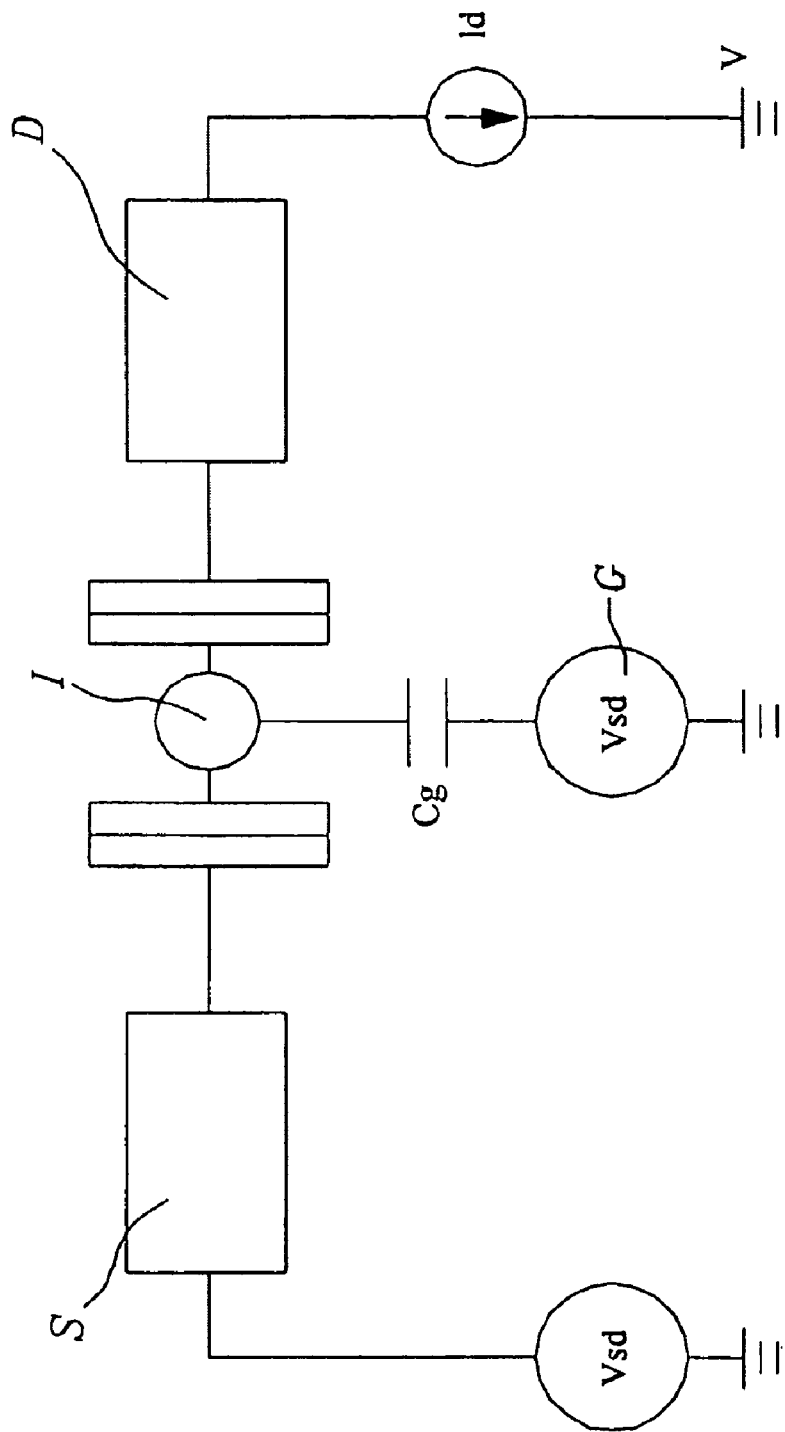
FIG. 23 is the fundamental circuit diagram of the SET (Single Electron Transistor).

As shown in the FIG. 23 is the fundamental circuit diagram of the SET (Single Electron Transistor), which is a triode with extra island electrode I in addition to three basic electrodes of source electrode S, drain electrode D and gate electrode G;

Wherein, said island electrode I locates between said source electrode S and drain electrode D, and a tunnel junction is built in each joint of two electrodes;

Namely, there are two tunnel junctions sharing one common said island electrode I.

A (tunnel junction) is a thin insulating barrier between two conducting electrodes.

The structure of the SET has following features:
- (1): Said gate electrode G is coupled to said island electrode I by a virtual capacitor ($C_g$);
- (2): Said tunnel junction is substantially a dielectric, which has both properties of resistor and capacitor behavior:

As a capacitor: The capacitance of is approximately equal to the following formula:

$$C = \epsilon_0 \cdot \epsilon_r \cdot A/d$$

Where: (C) is the capacitance in farads
($\epsilon_0$) is the permittivity of free space
($\epsilon_r$) is the dielectric constant or relative permittivity
(A) is the area of each plane electrode
(d) is the separation between the electrodes The tunnel junction capacitor is charged with one elementary charge by the tunneling electron, causing a voltage buildup (V=e/C), Where: (V) is the voltage built up at tunnel junction
(e) is the elementary charge of 1.6×10-19 coulomb
(C) is the capacitance of the junction As a resistor: The resistance depends exponentially on the barrier thickness;

Typical barrier thickness is on the order of one to several nano-meters;

Unlike classical electrodynamics, the characteristic resistance is dynamical and nonlinear, namely no longer constant;

The increase of the differential resistance (R) at small or around zero bias voltages ($V_b$) is called the (Coulomb blockade);

- (3): Due to the discreteness of electrical charge, current flow through a tunnel junction is a series of events, in which exactly one electron passes (tunnels) through the tunnel barrier;

A continuous (non-discrete) charge can be induced on said island electrode I by said gate electrode G;

- (4): Basing on formulas: (V=e/C) and ($C=\epsilon_0 \cdot \epsilon_r \cdot A/d$), the (A) must be in nano-scale subject to the extreme low value of (e);

To make a tunnel junction in plate condenser geometry with a capacitance 1 femto-farad, using an oxide layer of electric permeability 10 and thickness one nano-meter, one has to create electrodes with dimensions of approximately 100 by 100 nano-meters;

- (5): The temperature has to be low enough so that the characteristic charging energy (the energy that is required to charge the junction with one elementary charge) is larger than the thermal energy of the charge carriers;

- (6): The tunneling current will happen only when both of the (Fermi energy level) in said (source electrode S and said drain electrode D being aligned with each other;

Due to these constraints mentioned above, the distance and size of said source electrode S, drain electrode D and island electrode I will vitally effect the performance and yield of said SET;

For current technology, it is very difficult and extremely expensive to achieve such requirements;

Therefore, the mass production of SET is still not applied in the semiconductor or electronic industries yet.

However, if the fabricating process in the present invention is adopted, the mass production of SET can be carried out and promoted in the semiconductor or electronic industries as the fabricating process in the present invention can precisely control the position, size, constituent and density of said source electrode S, drain electrode D, island electrode I and gate electrode G; The real fabricating process can be achieved by applying process steps in aforesaid embodiments in mutual coordination with each other.

Figure 24:
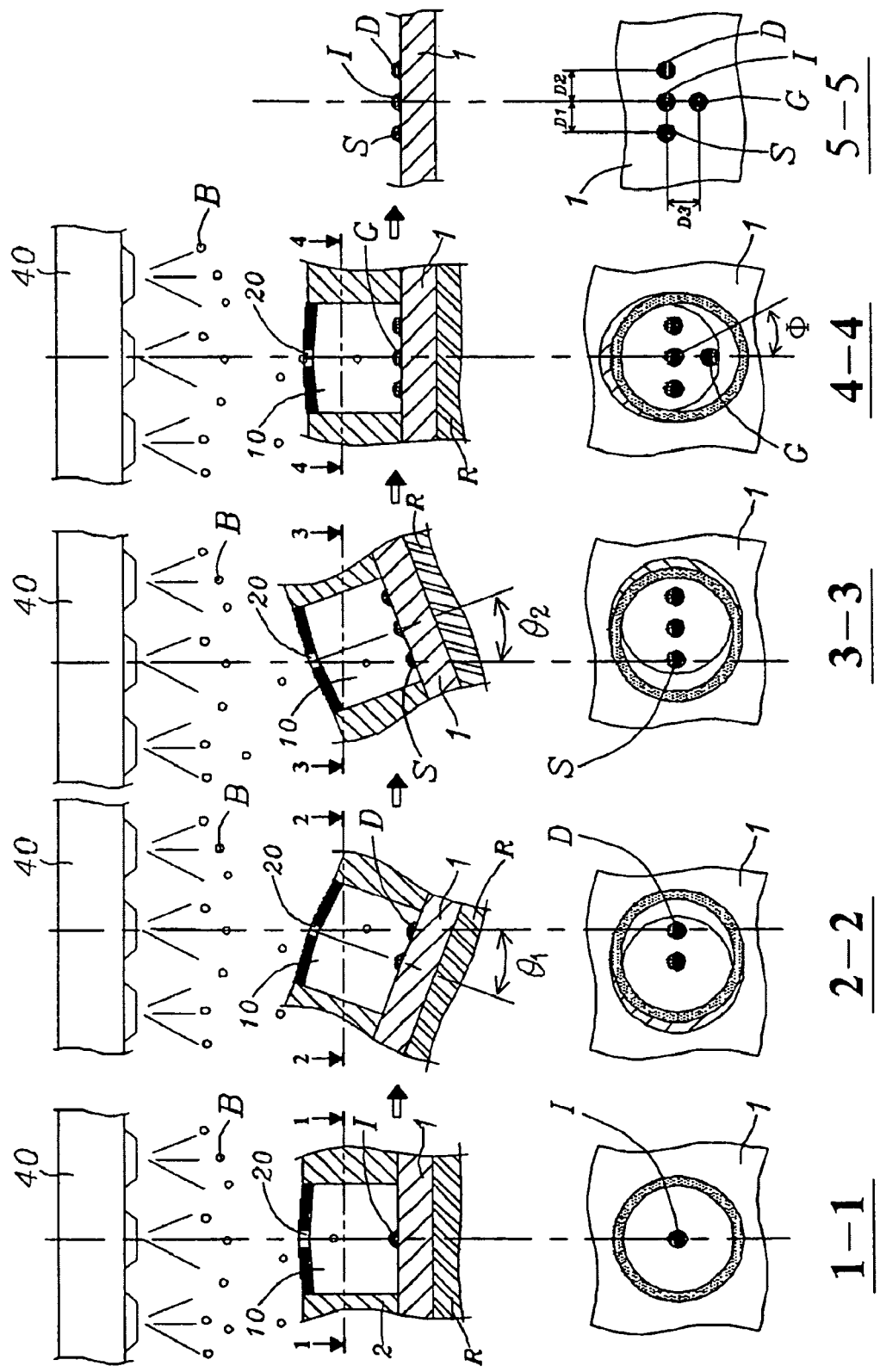
FIG. 24 is the illustrative flow chart showing the fabrication of source electrode, drain electrode, island electrode, and gate electrode of the SET on the surface of the substrate.

As shown in the FIG. 24 is the fabricating process of the SET (Single Electron Transistor).

The fabricating process steps comprise:
- (I) First deposit the (sealant=sealing material) A of gas molecule or atom state on the top-opening of the nano cylindrical pore 10, which having formed on the photo-resist 2 of the substrate 1, so that the diameter of said top-opening gradually reduce to become a reduced nano-aperture 20, whose opening diameter is smaller than that of said top-opening;
- (□) Keep said substrate 1 in horizontal direction, and align said deposit source device 40 to face towards said reduced nano-aperture 20, the island electrode I of first nano quantum dot is deposited at the expected central position on the surface of said substrate 1 by the deposit material B (as shown in 1-1 view of the FIG. 24);

(III) Said reduced nano-aperture 20 as center, tilt said substrate 1 rightwards into tilt angle θ1, the drain electrode D of second nano quantum dot is deposited at the expected right position of said existing island electrode I on the surface of said substrate 1 by the deposit material B (as shown in 2-2 view of the FIG. 24);

(IV) Again, said reduced nano-aperture 20 as center, tilt said substrate 1 leftwards into tilt angle θ2, the source electrode S of third nano quantum dot is deposited at the expected left position of said existing island electrode I on the surface of said substrate 1 by the deposit material B (as shown in 3-3 view of the FIG. 24); and (V) Finally, said reduced nano-aperture 20 as central axis, rotate said substrate 1 clockwise into rotation angle), the gate electrode G of fourth nano quantum dot is deposited at the expected front position of said existing island electrode I on the surface of said substrate 1 by the deposit material B (as shown in 4-4 view of the FIG. 24);

Wherein, if said tilt angle θ1 equals tilt angle θ2, then the distance D2 will equal D1; and D3 is controlled by the magnitude of said rotation angle Φ, where, D1 is the distance between said source electrode S and said island electrode I, D2 is the distance between said drain electrode D and said island electrode I, D3 is the distance between said gate electrode G and said island electrode I, (as shown in 5-5 view of the FIG. 24);

Therefore, by means of easily controllable adjustment of said tilt angle θ and rotation angle Φ, the position, size, distance or component density among said source electrode S, drain electrode D, island electrode I and gate electrode G can be precisely achieved; even requirement of different constituent for each of various nano quantum dot can also be satisfied by simple selection of different deposit material to coordinate in fabricating process;

Thus, not only the application range and expanding scope is extensively, but also the fabricating process can be performed under room temperature, so the integral practical and economical effect is really valuable.

As shown in the FIG. 25 through 29 is the other accomplishment of the present invention in fabricating a nano connecting wire in between the nano-circuits or nano-components.

Figure 25:
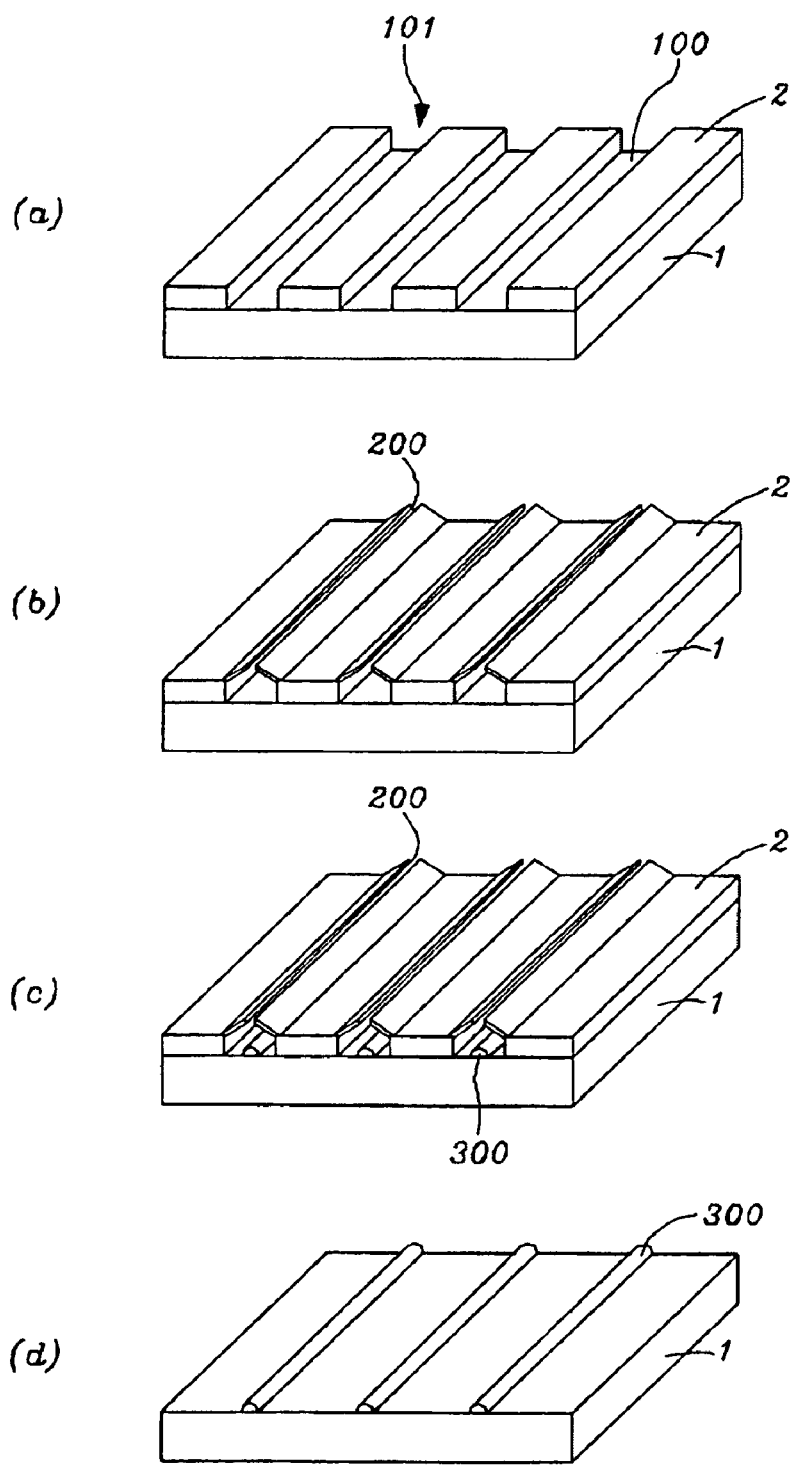
FIG. 25 is the perspective illustrative views in flow chart showing the formation of nano-wire according to the present invention.
Figure 26:
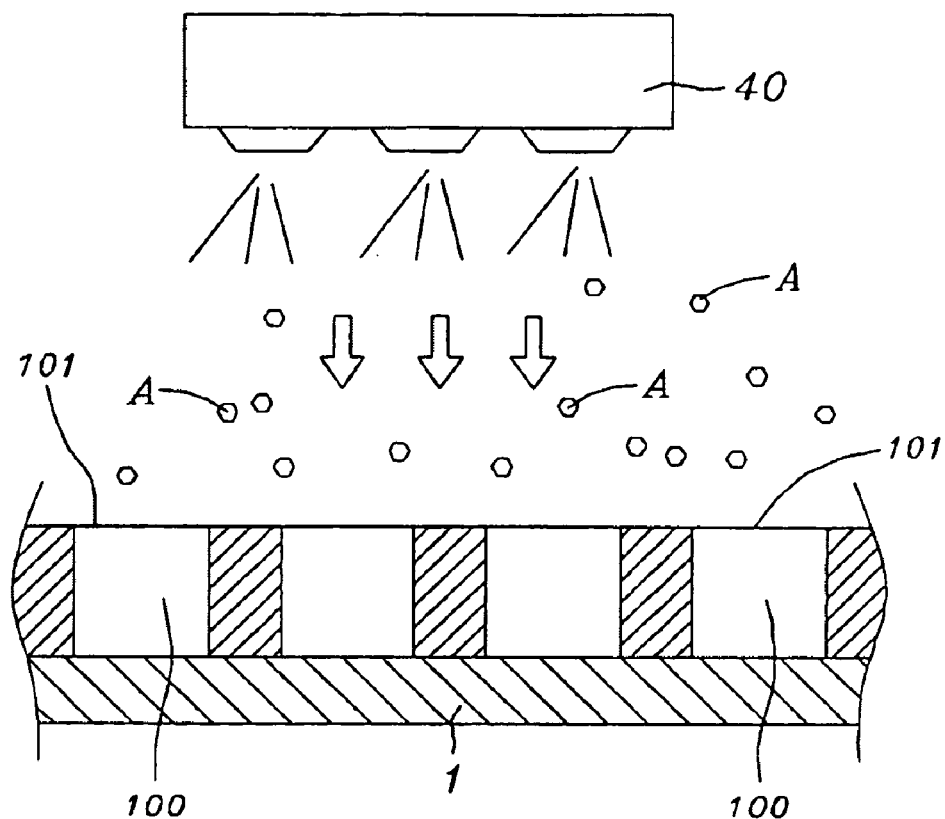
FIG. 26 is the first cross sectional illustrative view showing the formation of nano-wire according to the present invention.
Figure 27:
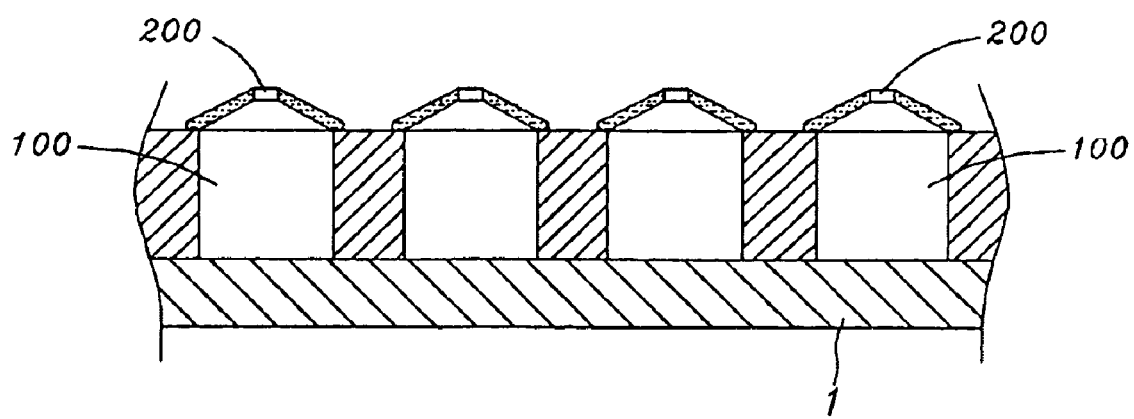
FIG. 27 is the second cross sectional illustrative view showing the formation of nano-wire according to the present invention.
Figure 28:
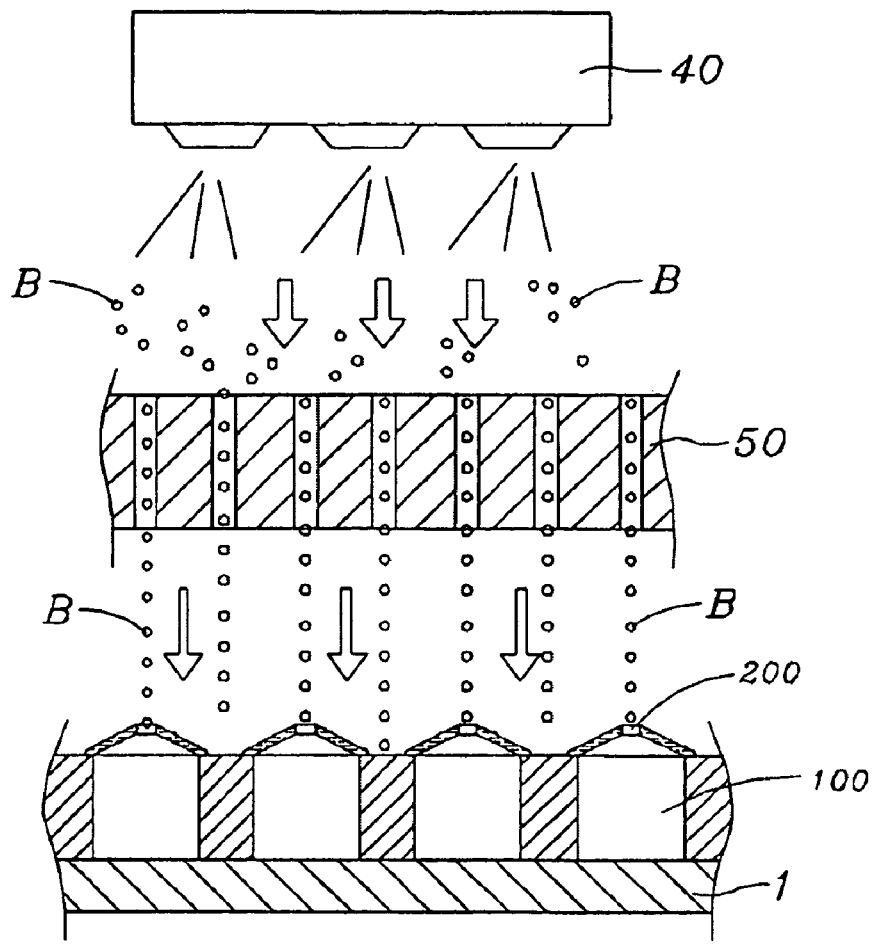
FIG. 28 is the third cross sectional illustrative view showing the formation of nano-wire according to the present invention.
Figure 29:
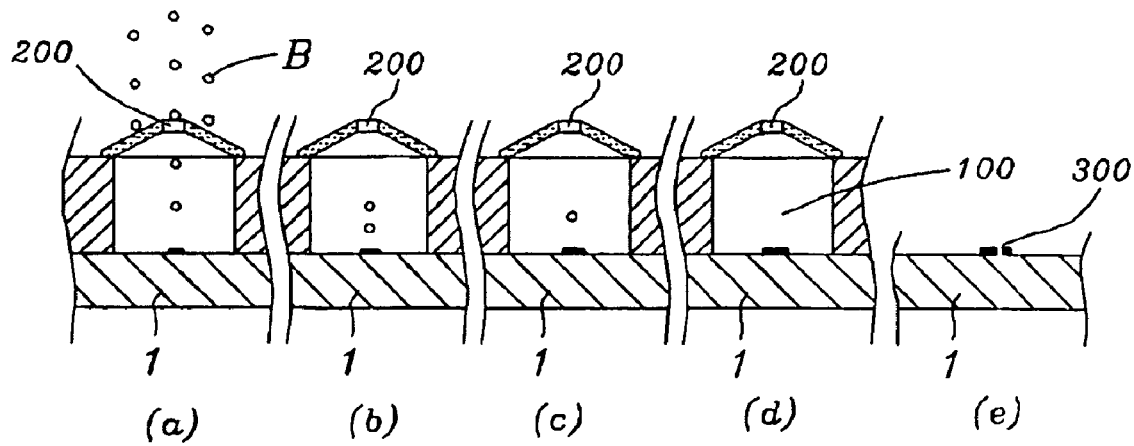
FIG. 29 is the fourth cross sectional illustrative view showing the formation of nano-wire according to the present invention.

The fabricating process steps comprise:

(a) First deposit the (sealant(=sealing material) A of molecule or atom state on the top slit 101 of the nano groove 100, which having formed on the photo-resist 2 of the substrate 1 (as shown in a view of the FIG. 25 and FIG. 26);

Thereby a reduced nano slit 200 with slit width being smaller than original opening width of said top slit 101 is formed by gradual narrowing of its opening from cumulative deposition (as shown in b view of the FIG. 25 and FIG. 27);

(b) Directly pass the deposit material B of gas molecule or atom state through said reduced nano slit 200 (as shown in the FIG. 28), a nano wire 300 with width being same as slit width of said reduced nano slit 200 is directly formed on said substrate 1, which laid beneath the bottom of said nano groove 100 (as shown in c view of the FIG. 25 and the a, b, c, d view of the FIG. 29); and (c) By means of solution rinsing (i.e. wet etching) or gas etching (i.e. dry etching), remove said nano groove 100 in said photo-resist 2 on said substrate 1;

Thereby a nano wire 300 structure with smaller nanoscale is directly formed on the surface of said substrate 1 (as shown in d view of the FIG. 25 and e view of the FIG. 29).

As shown in the FIGS. 30 and 31 is the other accomplishment of the present invention in fabricating a dented nanoquantum-dot instead of depositing bulged nano-quantum-dot by etchant (=etching material) C of gas molecule or atom state (as shown in the FIG. 30).

The process steps in fabricating nano dented dot 301 is as follows:

Directly pass the etchant (=etching material) C of gas molecule or atom state through the reduced nano-aperture 20 on the nano cylindrical pore 10, which being formed on the photo-resist 2 of the substrate 1 (as shown in the FIG. 30); Thereby the nano dented dot 301 is directly formed on the surface of said substrate 1 (as shown in e view of the FIG. 31);

The circumferential shape of said nano dented dot 301 is surrounded by link of irregular curves, and its size is same as said orifice diameter of said reduced nano-aperture 20.

Figure 32:
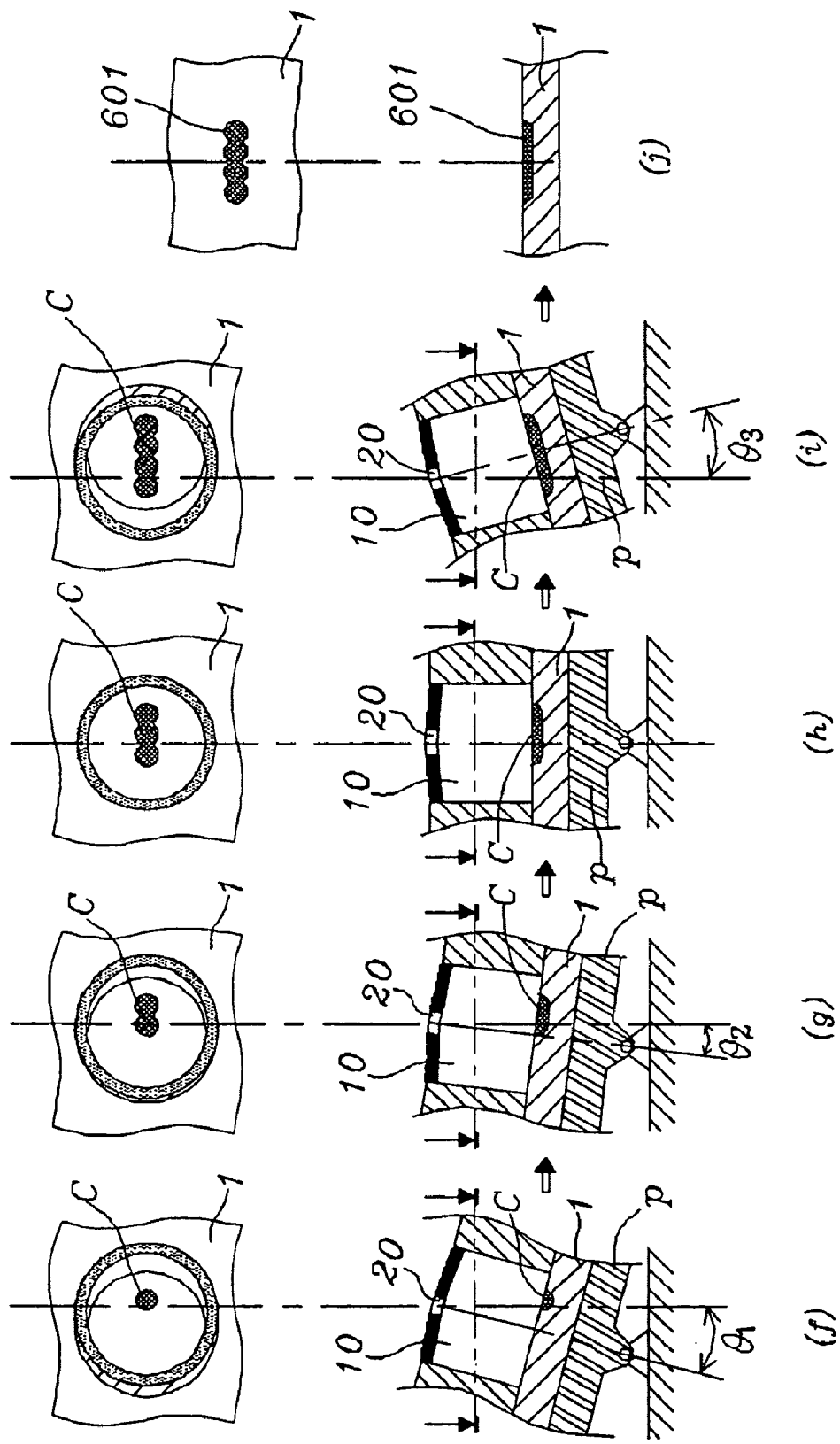
FIG. 32 is the illustrative view showing the etching of nano-dented-rod on the surface of the substrate according to the present invention.

As shown in the FIG. 32 is the other embodiment of the present invention in fabricating a dented nano-rod instead of depositing bulged nano-rod by etchant (=etching material) C of gas molecule or atom state.

The process steps in fabricating nano dented rod 601 is as follows:

First one-by-one orderly adjust the leftwards and rightwards tilt angle θ of said reduced nano-aperture 20 as θ1, η2 and θ3 etc. (as shown in f, g, h, i view of the FIG. 32 and each of corresponding top view);

Then, directly pass the etchant (=etching material) C of gas molecule or atom state through the reduced nano-aperture 20 on the nano cylindrical pore 10, which being formed on the photo-resist 2 of the substrate 1 (as shown in the FIG. 30); Thereby the nano dented rod 601 is one-by-one continuously formed on the surface of said substrate 1 (as shown in j view of the FIG. 32);

Thus, the maximum width of said nano dented rod 601 is equivalent to or less than the orifice diameter of said reduced nano-aperture 20, and both sides of the rod is shaped by link of irregular lines (as shown in the FIG. 32 and corresponding top view).

Figure 33:
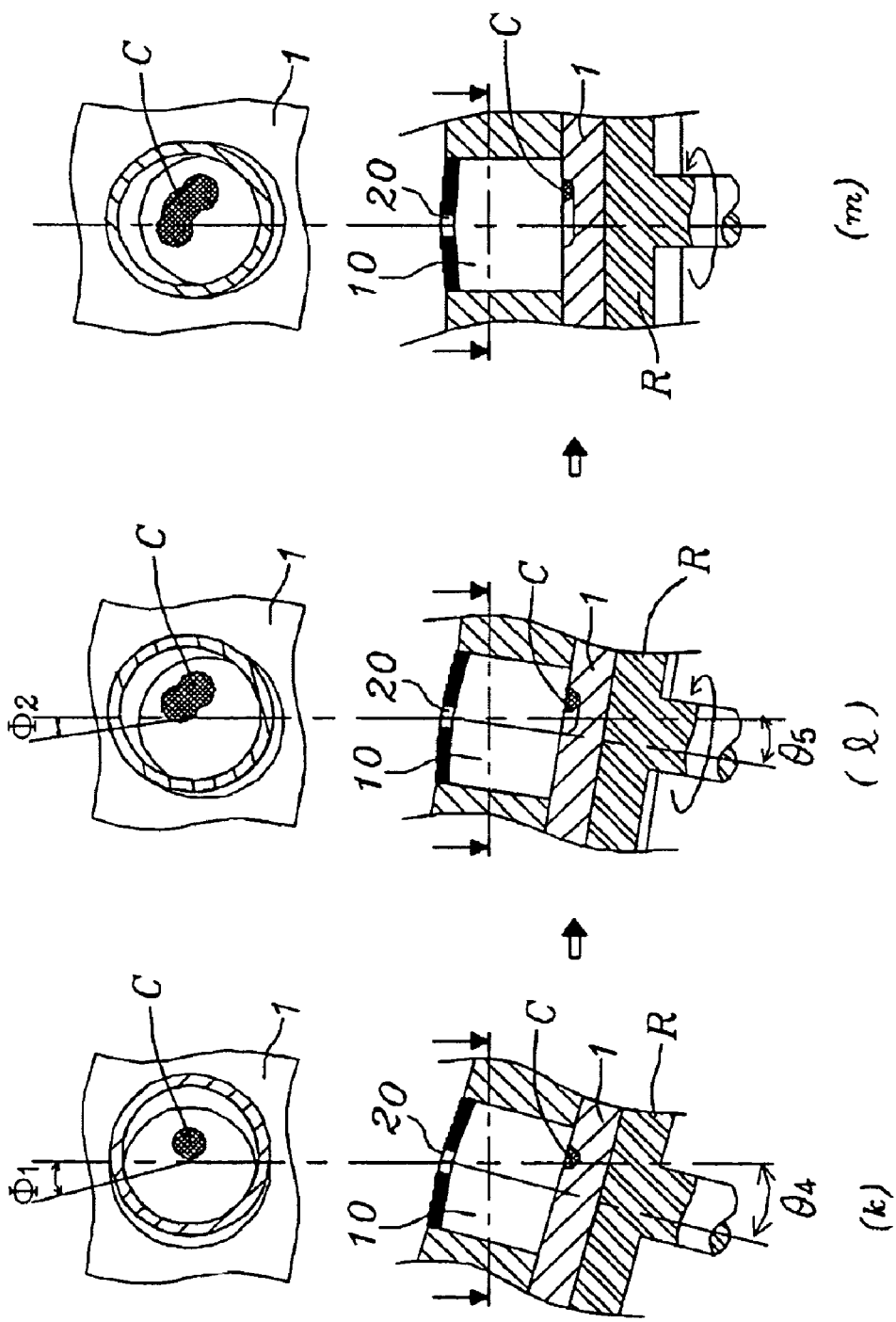
FIG. 33 is the illustrative view showing the etching of nano-dented-ring on the surface of the substrate according to the present invention.
Figure 33:
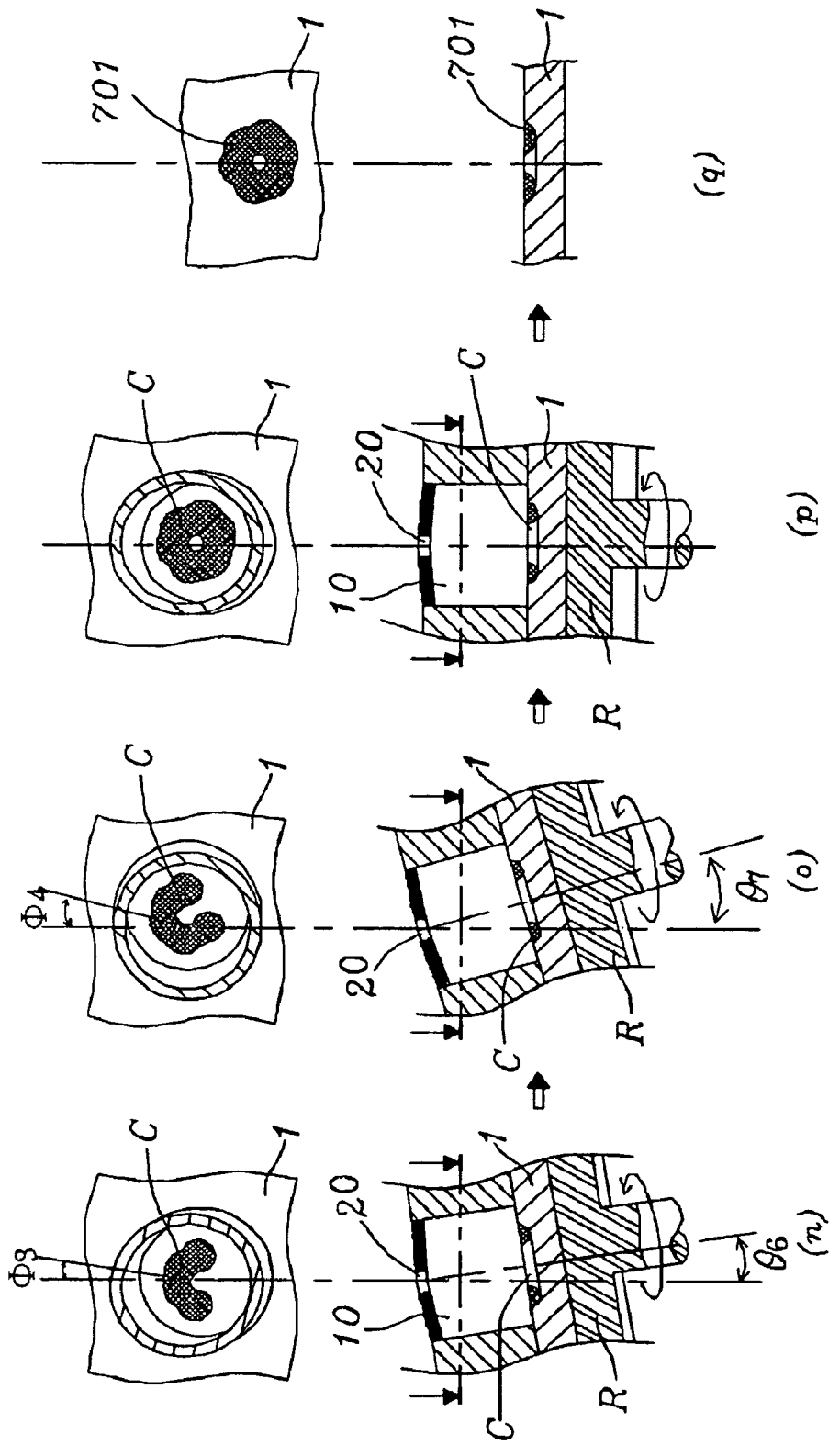

As shown in the FIG. 33 is the other accomplishment of the present invention in fabricating a dented nano-ring instead of depositing bulged nano-ring by etchant (=etching material) C of gas molecule or atom state.

The process steps in fabricating nano dented ring 701 is as follows:

First one-by-one orderly adjust said the rotation angle Φ of said reduced nano-aperture 20 as Φ1, Φ2, Φ3 and Φ4 etc. as well as in coordination with forwards and backwards tilt angle θ plus leftwards and rightwards yaw angle θ as θ4, θ5, θ6 and θ7 etc. (as shown in k, l, m, n, o view of the FIG. 33 and each of corresponding top view);

Then, directly pass the etchant (=etching material) C of gas molecule or atom state through the reduced nano-aperture 20 on the nano cylindrical pore 10, which being formed on the photo-resist 2 of the substrate 1 (as shown in the FIG. 30); Thereby the nano dented ring 701 is one-by-one continuously formed on the surface of said substrate 1 (as shown in p view of the FIG. 33 and corresponding top view);

Thus, the maximum outer diameter of said nano dented ring 701 is equivalent to or less than the orifice diameter of said reduced nano-aperture 20, and both sides of the bulged ring is surrounded by link of irregular curves (as shown in q view of the FIG. 33 and corresponding top view).

In conclusion, the nano-structure of "nano-component", "nano-circuit" or "nano-wire" etc. can be fabricated by the use of the present invention under process of room temperature into more microminiaturizing manner than that of the conventional way; It becomes very simple and cost-effective as well as technical breakthrough in fabricating process;

Thus, the present invention not only conforms to the industrial application and exploitation but also possesses the essential criteria of novelty, practical and advancement in patent.

What is claimed is:

1. A method of microminiaturizing a nano-structure, comprising the steps of:
    (a) providing a substrate and a layer including a nano cylindrical pore formed on said substrate;
    (b) depositing a deposit material on a top edge of said nano cylindrical pore to form a structure that extends radially inward from said top rim, placing said substrate on a movable platform at a non-zero tilt angle relative to an angle of incidence of said deposit material on said top rim, and rotating said movable platform at least once during deposition of said deposit material to deposit said deposit material around a circumference of said rim and thereby reduce a size of the top opening of the nano cylindrical pore;
    (c) passing a nano-structure-forming material through the reduced-size top opening to form a nano-structure on a surface of the substrate, said nano-structure having dimensions corresponding to dimensions of said reduced-size top opening; and
    (d) removing at least a portion of said layer, including said nano cylindrical pore.

2. A method as claimed in claim 1, wherein step (b) further comprises the step of rotating said movable platform a plurality of times during deposition of said deposit material to further reduce a size of the top opening comprising the step of rotating said movable platform a plurality of times during deposition of said deposit material to further reduce the size of the top opening.

3. A method as claimed in claim 1, wherein step (b) further comprises the step of using a membrane thickness meter to monitor a diameter of the reduced size top opening during deposition of said deposit material, and controlling a rotational speed of the movable platform in response to said monitoring.

4. A method as claimed in claim 1, wherein step (b) further comprises the steps of providing a closed top over said nano cylindrical pore and forming said reduced-size opening in said closed top.

5. A method as claimed in claim 4, wherein said reduced-size opening is formed by etching said closed top.

6. A method as claimed in claim 5, wherein said reduced-size opening is formed by applying an etching material to said closed top.

7. A method as claimed in claim 5, wherein said reduced-size opening is formed by sputter etching said closed top.

8. A method as claimed in claim 1, wherein said nano-structure-forming material is deposited directly on said substrate to form said nano-structure.

9. A method as claimed in claim 1, wherein said nano-structure-forming material includes an etchant and said nano-structure includes an etched area of said substrate.

10. A method as claimed in claim 6, further comprising the step of depositing a second nano-structure-forming material directly on an etched area of said substrate.

11. A method as claimed in claim 1, wherein a diameter of said nano-structure is the same as a diameter of said reduced-size opening to form a quantum dot.

12. A method as claimed in claim 1, wherein step (c) comprises the step of positioning a collimator between a source of said material and said reduced-size aperture.

13. A method as claimed in claim 1, wherein step (c) comprises the steps of placing said substrate on a movable platform and moving the platform linearly while passing said nano-structure-forming material through said aperture and depositing said nano-structure forming material directly on said substrate to form a nano rod having a width that is smaller than a diameter of said nano cylindrical pore.

14. A method as claimed in claim 1, wherein step (c) comprises the step of placing said substrate on a movable platform and moving the platform in three-dimensions to form a nano ring having dimensions smaller than a diameter of said nano cylindrical pore.

15. A method as claimed in claim 1, wherein step (d) comprises the step of wet etching to remove said layer, including said nano cylindrical pore.

16. A method as claimed in claim 1, wherein step (d) comprises the step of dry etching to remove said layer, including said nano cylindrical pore.

17. A method as claimed in claim 1, wherein said layer is a photoresist layer.

18. A method as claimed in claim 1, further comprising the steps of placing said substrate on a movable platform and, after forming a first said nano-structure, moving said platform and forming at least one additional said nano-structure.

19. A method of forming a reduced-size nano aperture on a top opening of a nano cylindrical pore, comprising the step of depositing a deposit material on a top edge of said nano cylindrical pore to form a structure that extends radially inward from said top rim, wherein said nano cylindrical pore is included in a layer formed on a substrate, and further comprising the steps of placing said substrate on a movable platform at a non-zero tilt angle relative to an angle of incidence of said deposit material on said top rim, and rotating said movable platform at least once during deposition of said deposit material to deposit said deposit material around a circumference of said rim and thereby reduce a size of the top opening of said nano cylindrical pore.

20. A method as claimed in claim 19, further comprising the step of rotating said movable platform a plurality of times during deposition of said deposit material to further reduce a size of the top opening.

21. A method as claimed in claim 20, wherein said platform is rotated to a first position and stopped during deposition of a portion of said deposit material, and wherein said platform is then rotated to at least one second position and stopped during deposition of a further portion of said deposit material.

22. A method as claimed in claim 20, wherein said platform is rotated continuously during deposition of said deposit material.

23. A method as claimed in claim 19, further comprising the step of using a membrane thickness meter to monitor a diameter of the reduced size top opening during deposition of said deposit material, and controlling a rotational speed of the movable platform in response to said monitoring.

24. A method as claimed in claim 19, further comprising the step of providing a closed top over said nano cylindrical pore and forming said reduced-size opening in said closed top.

25. A method as claimed in claim 24, wherein said reduced-size opening is formed by etching said closed top.

26. A method as claimed in claim 25, wherein said reduced-size opening is formed by applying an etching material to said closed top.

27. A method as claimed in claim 25, wherein said reduced-size opening is formed by sputter etching said closed top.

28. A method of forming a nano-structure on a substrate, comprising the steps of providing a nano cylindrical pore in a layer formed on the substrate, said nano cylindrical pore having a top opening whose diameter is less than a diameter of said nano cylindrical pore, and passing a nano-structure forming material through said top opening to directly form the nano-structure on a surface of the substrate, said nano-structure having dimensions corresponding to dimensions of said reduced-size top opening.

29. A method as claimed in claim 28, wherein said top opening is a slot, said nano structure having a width that corresponds to a width of said slot.

30. A method as claimed in claim 29, wherein said nano-structure is a nano connecting wire.

* * * * *